(12) United States Patent
Tendulkar et al.

(10) Patent No.: US 8,895,949 B2
(45) Date of Patent: *Nov. 25, 2014

(54) NONVOLATILE MEMORY DEVICE USING A VARISTOR AS A CURRENT LIMITER ELEMENT

(71) Applicants: SanDisk 3D LLC, Milpitas, CA (US); Kabushiki Kaisha Toshiba, Tokyo (JP)

(72) Inventors: Mihir Tendulkar, Mountain View, CA (US); Imran Hashim, Saratoga, CA (US); Yun Wang, San Jose, CA (US)

(73) Assignees: SanDisk 3D LLC, Milpitas, CA (US); Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/176,882

(22) Filed: Feb. 10, 2014

(65) Prior Publication Data

US 2014/0151625 A1    Jun. 5, 2014

Related U.S. Application Data

(63) Continuation of application No. 13/399,815, filed on Feb. 17, 2012, now Pat. No. 8,686,386.

(51) Int. Cl.
*H01L 29/02* (2006.01)
*H01L 45/00* (2006.01)
*H01L 27/24* (2006.01)

(52) U.S. Cl.
CPC ............ *H01L 45/1608* (2013.01); *H01L 45/08* (2013.01); *H01L 45/12* (2013.01); *H01L 45/1233* (2013.01); *H01L 45/146* (2013.01); *H01L 45/1616* (2013.01); *H01L 27/2409* (2013.01); *H01L 27/2463* (2013.01)
USPC ............................ 257/2; 257/3; 257/4; 257/5

(58) Field of Classification Search
USPC .......................................... 257/2–5; 365/148
See application file for complete search history.

(56) References Cited

U.S. PATENT DOCUMENTS

| 5,311,039 A | 5/1994 | Kimura et al. |
| 5,373,169 A | 12/1994 | McCollum et al. |

(Continued)

FOREIGN PATENT DOCUMENTS

| JP | 08-316324 | 11/1996 |
| JP | 2005-123575 | 5/2005 |
| WO | 2005124787 | 12/2005 |

OTHER PUBLICATIONS

U.S. Appl. No. 14/133,107, filed Dec. 18, 2013.

(Continued)

*Primary Examiner* — Matthew W Such
*Assistant Examiner* — Frederick B Hargrove
(74) *Attorney, Agent, or Firm* — Vierra Magen Marcus LLP

(57) ABSTRACT

Embodiments of the invention include a method of forming a nonvolatile memory device that contains a resistive switching memory element that has improved device switching performance and lifetime, due to the addition of a current limiting component disposed therein. The electrical properties of the current limiting component are configured to lower the current flow through the variable resistance layer during the logic state programming steps by adding a fixed series resistance in the resistive switching memory element of the nonvolatile memory device. In some embodiments, the current limiting component comprises a varistor that is a current limiting material disposed within a resistive switching memory element in a nonvolatile resistive switching memory device. Typically, resistive switching memory elements may be formed as part of a high-capacity nonvolatile memory integrated circuit, which can be used in various electronic devices, such as digital cameras, mobile telephones, handheld computers, and music players.

18 Claims, 9 Drawing Sheets

(56) References Cited

U.S. PATENT DOCUMENTS

| | | |
|---|---|---|
| 5,379,250 A | 1/1995 | Harshfield |
| 5,475,253 A | 12/1995 | Look et al. |
| 5,486,707 A | 1/1996 | Look et al. |
| 5,688,158 A | 11/1997 | Jones et al. |
| 5,818,749 A | 10/1998 | Harshfield |
| 5,915,167 A | 6/1999 | Leedy |
| 6,034,882 A | 3/2000 | Johnson et al. |
| 6,100,120 A | 8/2000 | Yu |
| 6,306,715 B1 | 10/2001 | Chan et al. |
| 6,342,414 B1 | 1/2002 | Xiang et al. |
| 6,351,406 B1 | 2/2002 | Johnson et al. |
| 6,369,421 B1 | 4/2002 | Xiang et al. |
| 6,376,787 B1 | 4/2002 | Martin et al. |
| 6,403,434 B1 | 6/2002 | Yu |
| 6,420,215 B1 | 7/2002 | Knall et al. |
| 6,426,891 B1 | 7/2002 | Katori |
| 6,434,060 B1 | 8/2002 | Tran et al. |
| 6,451,641 B1 | 9/2002 | Halliyal et al. |
| 6,451,647 B1 | 9/2002 | Yang et al. |
| 6,455,424 B1 | 9/2002 | McTeer et al. |
| 6,456,524 B1 | 9/2002 | Perner et al. |
| 6,465,804 B1 | 10/2002 | Shamir et al. |
| 6,475,874 B2 | 11/2002 | Xiang et al. |
| 6,483,734 B1 | 11/2002 | Sharma et al. |
| 6,486,065 B2 | 11/2002 | Vyvoda et al. |
| 6,490,218 B1 | 12/2002 | Vyvoda et al. |
| 6,492,241 B1 | 12/2002 | Rhodes et al. |
| 6,495,437 B1 | 12/2002 | Yu |
| 6,514,808 B1 | 2/2003 | Samavedam et al. |
| 6,515,888 B2 | 2/2003 | Johnson et al. |
| 6,525,953 B1 | 2/2003 | Johnson |
| 6,534,403 B2 | 3/2003 | Cleeves |
| 6,534,841 B1 | 3/2003 | Van Brocklin et al. |
| 6,549,447 B1 | 4/2003 | Fricke et al. |
| 6,551,885 B1 | 4/2003 | Yu |
| 6,552,409 B2 | 4/2003 | Taussig et al. |
| 6,559,014 B1 | 5/2003 | Jeon |
| 6,574,145 B2 | 6/2003 | Kleveland et al. |
| 6,579,760 B1 | 6/2003 | Lung |
| 6,580,115 B2 | 6/2003 | Agarwal |
| 6,586,349 B1 | 7/2003 | Jeon et al. |
| 6,587,394 B2 | 7/2003 | Hogan |
| 6,617,639 B1 | 9/2003 | Wang et al. |
| 6,661,691 B2 | 12/2003 | Fricke et al. |
| 6,686,646 B2 | 2/2004 | Lee |
| 6,689,644 B2 | 2/2004 | Johnson |
| 6,690,597 B1 | 2/2004 | Perlov et al. |
| 6,704,235 B2 | 3/2004 | Knall et al. |
| 6,750,079 B2 | 6/2004 | Lowrey et al. |
| 6,753,561 B1 | 6/2004 | Rinerson et al. |
| 6,784,517 B2 | 8/2004 | Kleveland et al. |
| 6,816,410 B2 | 11/2004 | Kleveland et al. |
| 6,822,888 B2 | 11/2004 | Peng |
| 6,842,369 B2 | 1/2005 | Koll et al. |
| 6,879,505 B2 | 4/2005 | Scheuerlein |
| 6,906,361 B2 | 6/2005 | Zhang |
| 6,937,507 B2 | 8/2005 | Chen |
| 6,937,509 B2 | 8/2005 | Perner et al. |
| 6,937,528 B2 | 8/2005 | Hush et al. |
| 6,952,030 B2 | 10/2005 | Herner et al. |
| 7,009,694 B2 | 3/2006 | Hart et al. |
| 7,012,297 B2 | 3/2006 | Bhattacharyya |
| 7,052,941 B2 | 5/2006 | Lee |
| 7,172,840 B2 | 2/2007 | Chen |
| 7,176,064 B2 | 2/2007 | Herner et al. |
| 7,206,214 B2 | 4/2007 | Hoefler et al. |
| 7,271,081 B2 | 9/2007 | Li et al. |
| 7,303,971 B2 | 12/2007 | Hsu et al. |
| 7,304,888 B2 | 12/2007 | Knall |
| 7,405,465 B2 | 7/2008 | Herner |
| 7,410,838 B2 | 8/2008 | Ang |
| 7,446,010 B2 | 11/2008 | Li |
| 7,453,755 B2 | 11/2008 | Cleeves |
| 7,575,984 B2 | 8/2009 | Radigan et al. |
| 7,608,514 B2 | 10/2009 | Hsu |
| 7,629,198 B2 | 12/2009 | McNamara et al. |
| 7,633,108 B2 | 12/2009 | Li |
| 7,649,768 B2 | 1/2010 | Hirose |
| 7,706,169 B2 | 4/2010 | Kumar |
| 7,863,598 B2* | 1/2011 | Sugita et al. ............... 257/5 |
| 7,875,871 B2 | 1/2011 | Kumar et al. |
| 7,920,408 B2 | 4/2011 | Azuma et al. |
| 7,968,419 B2 | 6/2011 | Li |
| 8,058,636 B2 | 11/2011 | Osano et al. |
| 8,072,795 B1 | 12/2011 | Wang et al. |
| 8,093,682 B2 | 1/2012 | Hirose |
| 8,148,711 B2 | 4/2012 | Fujii et al. |
| 8,183,553 B2 | 5/2012 | Phatak et al. |
| 8,279,657 B2 | 10/2012 | Takagi et al. |
| 8,339,834 B2 | 12/2012 | Nakai et al. |
| 8,343,813 B2 | 1/2013 | Kuse et al. |
| 8,410,467 B2 | 4/2013 | Wada |
| 8,558,208 B2 | 10/2013 | Fujitsuka et al. |
| 8,592,798 B2 | 11/2013 | Mikawa et al. |
| 2002/0019039 A1 | 2/2002 | Davis et al. |
| 2002/0070754 A1 | 6/2002 | Lambertson |
| 2002/0086476 A1 | 7/2002 | Kim et al. |
| 2003/0026158 A1 | 2/2003 | Knall et al. |
| 2003/0062595 A1 | 4/2003 | Anthony |
| 2003/0081445 A1 | 5/2003 | Van Brocklin et al. |
| 2003/0169625 A1 | 9/2003 | Hush et al. |
| 2004/0002184 A1 | 1/2004 | Cleeves |
| 2004/0016991 A1 | 1/2004 | Johnson et al. |
| 2004/0108573 A1 | 6/2004 | Herner et al. |
| 2004/0183144 A1 | 9/2004 | Beaman et al. |
| 2004/0245547 A1 | 12/2004 | Stipe |
| 2005/0014322 A1 | 1/2005 | Herner et al. |
| 2005/0026334 A1 | 2/2005 | Knall |
| 2005/0052915 A1 | 3/2005 | Herner et al. |
| 2005/0098800 A1 | 5/2005 | Herner et al. |
| 2005/0121742 A1 | 6/2005 | Petti et al. |
| 2005/0121743 A1 | 6/2005 | Herner |
| 2005/0124116 A1 | 6/2005 | Hsu |
| 2005/0221200 A1 | 10/2005 | Chen |
| 2005/0226067 A1 | 10/2005 | Herner et al. |
| 2006/0073642 A1 | 4/2006 | Yeh et al. |
| 2006/0076549 A1 | 4/2006 | Ufert |
| 2006/0171200 A1 | 8/2006 | Rinerson et al. |
| 2006/0197115 A1 | 9/2006 | Toda |
| 2006/0197180 A1 | 9/2006 | Lai et al. |
| 2006/0203541 A1 | 9/2006 | Toda |
| 2006/0249753 A1 | 11/2006 | Herner et al. |
| 2006/0250837 A1 | 11/2006 | Herner et al. |
| 2006/0252281 A1 | 11/2006 | Park et al. |
| 2006/0268594 A1 | 11/2006 | Toda |
| 2006/0273298 A1 | 12/2006 | Petti et al. |
| 2007/0008773 A1 | 1/2007 | Scheuerlein |
| 2007/0015330 A1 | 1/2007 | Li et al. |
| 2007/0015348 A1 | 1/2007 | Hsu et al. |
| 2007/0069241 A1 | 3/2007 | Yang et al. |
| 2007/0072360 A1 | 3/2007 | Kumar et al. |
| 2007/0087508 A1 | 4/2007 | Herner |
| 2007/0190722 A1 | 8/2007 | Herner |
| 2007/0228414 A1 | 10/2007 | Kumar et al. |
| 2007/0228442 A1 | 10/2007 | Kakimoto |
| 2008/0025078 A1 | 1/2008 | Scheuerlein et al. |
| 2008/0090337 A1 | 4/2008 | Williams |
| 2008/0128853 A1 | 6/2008 | Choi et al. |
| 2008/0219039 A1 | 9/2008 | Kumar et al. |
| 2008/0239790 A1 | 10/2008 | Herner et al. |
| 2009/0003036 A1 | 1/2009 | Kumar et al. |
| 2009/0026124 A1* | 1/2009 | Malhotra et al. ............... 257/2 |
| 2009/0085154 A1 | 4/2009 | Herner et al. |
| 2009/0086521 A1 | 4/2009 | Herner et al. |
| 2009/0101965 A1 | 4/2009 | Chen et al. |
| 2009/0168492 A1 | 7/2009 | Thorp et al. |
| 2009/0227067 A1 | 9/2009 | Kumar et al. |
| 2009/0256130 A1 | 10/2009 | Schricker |
| 2009/0257270 A1* | 10/2009 | Schricker et al. ............ 365/148 |
| 2009/0272959 A1 | 11/2009 | Phatak et al. |
| 2009/0272961 A1 | 11/2009 | Miller et al. |
| 2009/0272962 A1 | 11/2009 | Kumar et al. |
| 2009/0283736 A1* | 11/2009 | Kanzawa et al. ............... 257/2 |
| 2010/0072451 A1 | 3/2010 | Terao et al. |

(56) References Cited

U.S. PATENT DOCUMENTS

| | | |
|---|---|---|
| 2010/0085794 A1 | 4/2010 | Chen et al. |
| 2010/0265750 A1 | 10/2010 | Yan et al. |
| 2011/0002154 A1* | 1/2011 | Mitani et al. .................. 365/148 |
| 2011/0037043 A1 | 2/2011 | Wada |
| 2011/0062557 A1 | 3/2011 | Bandyopadhyay et al. |
| 2011/0069532 A1 | 3/2011 | Ichihara et al. |
| 2011/0085370 A1 | 4/2011 | Chen et al. |
| 2011/0089391 A1 | 4/2011 | Mihnea et al. |
| 2011/0140762 A1 | 6/2011 | Jiang et al. |
| 2011/0149634 A1 | 6/2011 | Schloss et al. |
| 2011/0194329 A1 | 8/2011 | Ohba et al. |
| 2011/0310653 A1 | 12/2011 | Kreupl et al. |
| 2011/0310654 A1 | 12/2011 | Kreupl et al. |
| 2011/0310655 A1 | 12/2011 | Kreupl et al. |
| 2011/0310656 A1 | 12/2011 | Kreupl et al. |
| 2012/0018695 A1 | 1/2012 | Lee et al. |
| 2012/0025164 A1 | 2/2012 | Deweerd et al. |
| 2012/0091419 A1 | 4/2012 | Chen et al. |
| 2012/0091427 A1 | 4/2012 | Chen et al. |
| 2012/0170353 A1 | 7/2012 | Iijima et al. |
| 2012/0193600 A1 | 8/2012 | Himeno et al. |
| 2012/0295413 A1 | 11/2012 | Fujii et al. |
| 2012/0313063 A1 | 12/2012 | Wang et al. |
| 2012/0313069 A1 | 12/2012 | Wang et al. |
| 2013/0026438 A1 | 1/2013 | Wang et al. |
| 2013/0028003 A1 | 1/2013 | Wang et al. |
| 2013/0056700 A1 | 3/2013 | Wang et al. |
| 2013/0065377 A1 | 3/2013 | Gopal et al. |
| 2013/0140512 A1 | 6/2013 | Chen et al. |
| 2013/0140514 A1 | 6/2013 | Mikawa et al. |
| 2013/0148404 A1 | 6/2013 | Bandyopadhyay et al. |

OTHER PUBLICATIONS

Restriction Requirement dated Jan. 16, 2014 in U.S. Appl. No. 13/228,744.
Response to Restriction Requirement filed Jan. 28, 2014 in U.S. Appl. No. 13/228,744.
Response to Office Action filed Jan. 24, 2014 in U.S. Appl. No. 13/465,263.
Response to Office Action filed Oct. 28, 2013 in U.S. Appl. No. 13/399,530.
Final Office Action dated Oct. 24, 2013 in U.S. Appl. No. 13/465,263.
U.S. Appl. No. 14/075,036, filed Nov. 8, 2013.
Notice of Allowance and Fee(s) Due dated Nov. 20, 2013 in U.S. Appl. No. 13/354,006.
Notice of Allowance and Fee(s) Due dated Nov. 1, 2013 in U.S. Appl. No. 13/353,000.
Notice of Allowance and Fee(s) Due dated Oct. 8, 2013 in U.S. Appl. No. 13/309,813.
Notice of Allowance and Fee(s) Due dated Oct. 17, 2013 in U.S. Appl. No. 13/223,950.
Wang, Jingtao et al., "Thin Film Embedded Resistors," IPC. Rev. (Jun. 2001).
Chen, A., "Current Overshoot During Set and Reset Operations of Resistive Switching Memories," IEEE; 2012 IEEE International Reliability Physics Symposium (IRPS), Apr. 15-19, 2012, pp. MY2.1-MY2.4.
Chen, Chung-Hui et al., "Nitrogen Implanted Polysilicon Resistor for High-Voltage CMOS Technology Application," Academia—National Cheng Kung University, Taiwan, IEEE Electron Device Letters vol. 22, No. 11; Nov. 2011, pp. 524-526.
Hieber, K., "Amorphous Chromium-Silicon: A Material for Kilo-Ohm Sheet Resistances," Siemens Aktiengesellschaft, Thin Solid Films, vol. 57, Issue 2, Mar. 1979, pp. 353-357.
Nardi, F., et al., "Control of Filament Size and Reduction of Reset Current Below 10 uA in NiO Resistance Switching Memories," Academia—Politecnico di Milano; Solid-State Electronics 58, Apr. 2011, pp. 42-47.
Nardi, F., et al., "Reset Current Reduction and Set-Reset Instabilities in Unipolar NiO RRAM," 2011 3rd IEEE International Memory Workshop (IMW), May 22-25, 2011, 4 pages.
Tirano, S., et al., "Accurate Analysis of Parasitic Current Overshoot During Forming Operation in RRAMs," CEA-LETI, France; Microelectronic Engineering 88, Jul. 2011, pp. 1129-1132.
Final Office Action dated Aug. 29, 2013 in U.S. Appl. No. 13/399,530.
Notice of Allowance and Fee(s) Due dated Sep. 4, 2013 in U.S. Appl. No. 13/309,813.
Notice of Allowance and Fee(s) Due dated Sep. 16, 2013 in U.S. Appl. No. 13/354,006.
Office Action dated Sep. 12, 2013 in U.S. Appl. No. 13/314,580.
Muller et al., "Device Electronics for Integrated Circuits, Second Edition", John Wiley & Sons, Inc., (1986), 192-200.
Li et al., Evaluation of SiO2 Antifuse in a 3D-OTP Memory, IEEE Transactions on Device and Materials Reliability, vol. 4, No. 3, Sep. 2004, pp. 416-421.
Herner et al., "Vertical p-i-n. Polysilicon Diode With Antifuse for Stackable Field-Programmable ROM," IEEE Electron Device Letters, vol. 25, No. 5, May 2004, pp. 271-273.
Herner et al., "Polycrystalline Silicon/CoSi2 Schottky Diode with Integrated SiO2 Antifuse: A Nonvolatile Memory Cell," Applied Physics Letters, vol. 82, No. 23, 2004, 4163-4165.
McPherson et al., "Proposed Universal Relationship Between Dielectric Breakdown and Dielectric Constant," IEEE International Electron Devices Meeting, 2002, pp. 26.6. 1-4.
McPherson et al., "Trends in the Ultimate Breakdown Strength of High Dielectric-Constant Materials", IEEE Transactions on Electron Devices, vol. 50, No. 8, (Aug. 2003), 1771-1778.
King, et al., "Punchthrough Diode as the Transient Voltage Suppressor for Low-Voltage Electronics," Nov. 1, 1996, 4 pages, vol. 43, No. 11, IEEE Transactions on Electron Devices, IEEE Service Center, Piscataway, NJ, USA.
Chen et al. U.S. Appl. No. 13/465,263, filed May 7, 2012.
Herner et al., "Vertical p-i-n Polysilicon Memory Switching: Electrothermal-Induced Order," IEEE Trans. Electron Devices, 53.9, pp. 2320-2327, Sep. 2006.
Bandyopadhyay et al., U.S. Appl. No. 13/780,089, filed Feb. 28, 2013.
Tendulkar et al., U.S. Appl. No. 13/354,006, filed Jan. 19, 2012.
Meyer, R., et al. "Oxide Dual-Layer Memory Element for Scalable Non-Volatile Cross-Point Memory, Technology," 9th Annual, Non-Volatile Memory Trechnology Symposium, Nov. 11-14, 2008, pp. 54-58.
L.M. Levinson, "Electronic Ceramics: Properties, Devices and Applications," (1988), p. 293.
Phatak et al., U.S. Appl. No. 13/189,065, filed Oct. 6, 2011.
Final Office Action dated Mar. 6, 2014 in U.S. Appl. No. 13/314,580.
Office Action dated Apr. 24, 2014 in U.S. Appl. No. 14/183,816.
Response to Final Office Action filed Apr. 25, 2014 in U.S. Appl. No. 13/314,580.
Notice of Allowance and Fee(s) Due dated May 2, 2014 in U.S. Appl. No. 13/399,530.
Advisory Action dated May 12, 2014 in U.S. Appl. No. 13/314,580.
Office Action dated Jun. 4, 2014 in U.S. Appl. No. 14/133,107.
Office Action dated Jun. 25, 2014 in U.S. Appl. No. 14/075,036.
Non-Final Rejection in U.S. Appl. No. 13/399,815 mailed Mar. 19, 2013.
Response to Non-Final Rejection in U.S. Appl. No. 13/399,815 mailed May 24, 2013.
Notice of Allowance and Fees Due in U.S. Appl. No. 13/399,815 mailed Aug. 15, 2013.
Notice of Allowance and Fees Due in U.S. Appl. No. 13/399,815 mailed Nov. 4, 2013.
Office Action dated Feb. 21, 2014 in U.S. Appl. No. 13/228,744.
Office Action dated Feb. 27, 2014 in U.S. Appl. No. 13/465,263.
U.S. Appl. No. 14/183,816, filed Feb. 19, 2014.
Response to Office Action filed Jul. 22, 2014 in U.S. Appl. No. 14/183,816.
International Search Report and Written Opinion dated Jul. 3, 2014 in Internationial Patent Application No. PCT/US2014/018123.
Notice of Allowance and Fee(s) Due dated Jul. 24, 2014 in U.S. Appl. No. 13/399,530.
Communication pursuant to Rules 161(2) and 162 EPC Aug. 6, 2014 in European Patent Application No. 112853845.1.
U.S. Appl. No. 14/458,295, filed Aug. 13, 2014.
Response to Office Action filed Sep. 4, 2014 in U.S. Appl. No. 14/133,107.

* cited by examiner

NONVOLATILE MEMORY DEVICE USING A VARISTOR AS A CURRENT LIMITER ELEMENT

REFERENCE TO RELATED APPLICATIONS

This application is a continuation of U.S. patent application Ser. No. 13/399,815, filed Feb. 17, 2012, now U.S. Pat. No. 8,686,386, which is incorporated by reference herein in its entirety for all purposes.

BACKGROUND

This invention relates to nonvolatile memory elements, and more particularly, to methods for forming resistive switching memory elements used in nonvolatile memory devices.

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide (MO) films has been demonstrated. Although metal oxide (MO) films such as these exhibit bistability, the resistance of these films and/or the ratio of the high-to-low resistance states is (are) often insufficient to be of use within a practical nonvolatile memory device. For instance, the resistance states of the metal oxide film should preferably be significant as compared to that of the system (e.g., the memory device and associated circuitry) so that any change in the resistance state change is perceptible.

Because the variation in the difference in the resistive states is related to the resistance of the resistive switching layer, it is often hard to use a low resistance metal oxide film to form a reliable nonvolatile memory device. For example, in a nonvolatile memory that has conductive lines formed of a relatively high resistance metal such as tungsten, the resistance of the conductive lines may overwhelm the resistance of the metal oxide resistive switching element if its resistance was not sufficiently high. This may make it difficult or impossible to sense the state of the bistable metal oxide resistive switching element.

Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (i.e., logic states of the device).

However, because the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 volts).

As nonvolatile memory device sizes shrink, it is important to reduce the required currents and voltages that are necessary to reliably set, reset and/or determine the desired "on" and "off" states of the device to minimize overall power consumption of the memory chip as well as resistive heating of the device and cross-talk between adjacent devices.

Moreover, as nonvolatile memory device sizes shrink it becomes increasingly necessary to assure that the "set" and "reset" currents used to change the state of the memory element are not too large to require higher voltage transistors for chip control circuitry, as well as to minimize damage to or alter the electrical or physical properties of the one or more layers found in the formed memory device. A large current flowing through the current carrying lines in a memory array also can undesirably alter or disturb the memory state of other interconnected devices or possibly damage portions of adjacent connected devices, due to an appreciable amount of "cross-talk" created between them.

There is a need to limit and/or minimize the required current used to sense and program the logic states of each of the interconnected devices to reduce chip overall power consumption and improve device longevity and reduce the possibility of cross-talk between adjacently connected devices, which can alter a nonvolatile memory's device state. It is also desirable to form a nonvolatile memory device that has low programming currents when switching the device between the "on" and "off" states.

Certain materials are known and have been used within the device to limit the current across the nonvolatile memory device while trying to resolve the cross-talk issue and lower the programming currents, but these materials through fabrication of the device or through regular device operation can contaminate or alter the properties of the metal oxide switching films and affect the performance of the switching memory element. Therefore, it is desirable to form a nonvolatile memory device that requires low programming currents to change the device between the "on" and "off" states.

SUMMARY

Embodiments of the invention generally relate to a resistive switching nonvolatile memory device having a passive current limiter layer and a barrier layer structure disposed between at least one of the electrodes and a variable resistance layer formed in the nonvolatile memory device. The resistive switching memory elements may be formed as part of a high-capacity nonvolatile memory integrated circuit, which can be used in various electronic devices, such as digital cameras, mobile telephones, handheld computers, and music players.

The resistive switching nonvolatile memory device comprises a variable resistance layer and current limiter layer that are configured to adjust the nonvolatile memory device's performance, such as lowering the formed device's switching currents and reducing the device's forming voltage, and reducing the performance variation from one formed device to another.

The present invention may provide a nonvolatile memory element, comprising a variable resistance layer comprising a metal oxide disposed between a first electrode layer and a second electrode layer with a separation layer comprising an oxygen deficient material disposed above the variable resistance layer and also a current limiter layer disposed between the first electrode layer and the separation layer.

Embodiments of the present invention may further provide a nonvolatile memory element including a variable resistance layer disposed between a first electrode layer and a second electrode layer with the variable resistance comprising a metal oxide. A current limiter layer comprising a varistor is disposed between the first electrode layer and the variable resistance layer, and a separation layer operable to inhibit the flow of oxygen ions is disposed between the current limiter layer and the variable resistance layer. The nonvolatile memory element includes a first stabilizing layer and a second stabilizing layer disposed on either side of the current limiter layer with the stabilizing layers operable to provide oxygen to the current limiter layer.

Embodiments of the present invention may further provide a method of forming the nonvolatile memory elements described above.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. The appended drawings illustrate only typical embodiments of this invention and are therefore not to be considered limiting of its scope, for the invention may admit to other equally effective embodiments.

Although the foregoing is directed to embodiments of the present invention, other and further embodiments of the invention may be devised without departing from the basic scope thereof, and the scope thereof is determined by the claims that follow.

DETAILED DESCRIPTION

Embodiments of the invention generally include a method of forming a nonvolatile memory device that contains a resistive switching memory element that has an improved device switching performance and increased usable lifetime, due to the addition of a current limiting component disposed therein. In some embodiments, the current limiting component comprises a varistor that is a resistive material that is disposed within a formed resistive switching memory element in a nonvolatile resistive switching memory device.

The electrical properties of the formed current limiting layer are configured to lower the current flow through the variable resistance layer by adding a fixed series resistance in the formed nonvolatile resistive switching memory device. It is generally desirable to form the current limiting layer so that its material and electrical properties will not degrade or breakdown during the often high current "burn-in" type device preparation steps, such as the "electrical forming" process, and also during normal repetitive operation of the nonvolatile resistive switching memory device.

Figure 1:
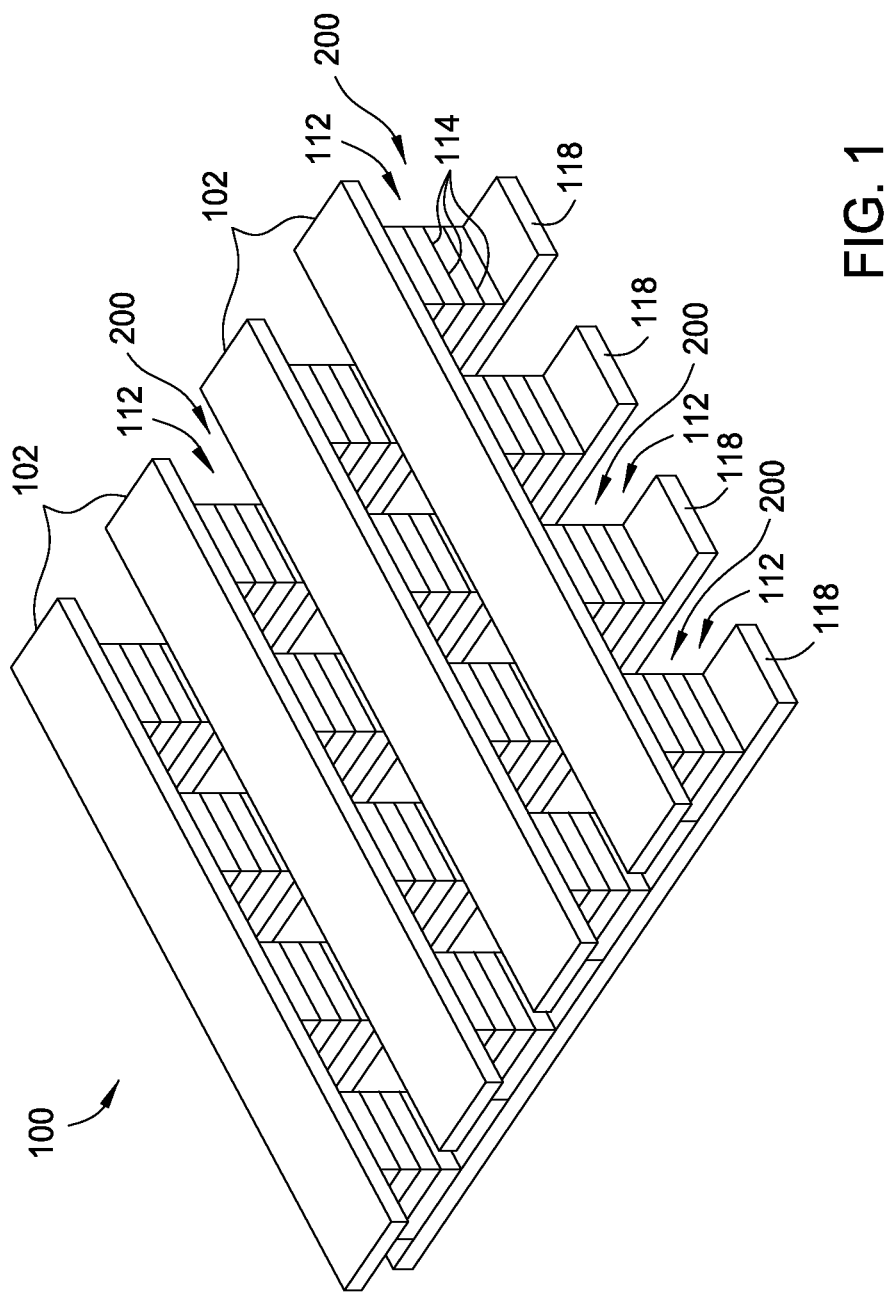
FIG. 1 illustrates an array of resistive switching memory elements in accordance with an embodiment of the invention.

An illustrative memory array 100 of nonvolatile resistive switching memory devices 200 (hereafter switching memory device 200), which each generally include at least one resistive switching memory element 112, is illustrated in FIG. 1. Memory array 100 may be part of a larger memory device or other integrated circuit structure, such as a system on a chip type device. Read and write circuitry is connected to switching memory devices 200 using word-lines and bit-lines, which are referred to herein generally as electrodes 102 and 118, and are used to read from or write data into the memory element 200.

Electrodes 102 and 118, generally include one or more conductive layers that each have a desired function in the array of switching memory devices 200. In some configurations, the electrodes 102 and 118 each comprise two or more conductive layers in which a first conductive layer is used to interconnect the multiple switching memory devices 200 and a second conductive layer is disposed in each switching memory device 200 to provide a desirable electrical interface (e.g., desirable work function) to the adjacent components in the switching memory device 200.

Individual switching memory devices 200 or groups of switching memory devices 200 can be accessed using appropriate sets of word-lines and bit-lines, or electrodes 102 and 118. The memory elements 112 in the switching memory devices 200 may be formed from one or more layers 114 of materials, as indicated schematically in FIG. 1. In addition, memory arrays such as memory array 100 can be stacked in a vertical fashion to make multilayer memory array structures. The use of resistive switching memory elements to form memory arrays is merely illustrative, and one skilled in the art will appreciate that the formed devices may be used in other device applications without deviating from the basic scope of the invention described herein.

Figure 2A:
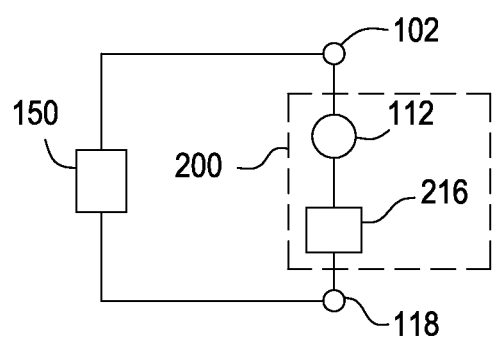
FIG. 2A is schematic representation of a memory device in accordance with an embodiment of the invention.

FIG. 2A schematically illustrates one example of a switching memory device 200 that contains a memory element 112 and an optional current steering device 216, which are both disposed between the electrodes 102 and 118. In one configuration, the current steering device 216 is an intervening electrical component, such as a p-n junction diode, p-i-n diode, transistor, or other similar device that is disposed between electrode 102 and memory element 112, or between the electrode 118 and memory element 112. In one example, the current steering device 216 may include two or more layers of semiconductor material, such as two or more doped silicon layers, that are configured to allow or inhibit the current flow in different directions through the memory element 112 when that memory element is not selected to read.

Figure 2B:
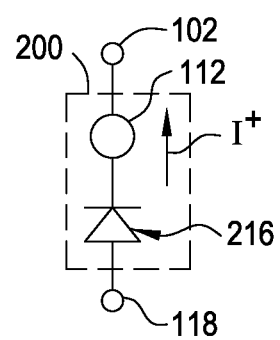
FIG. 2B is schematic representation of a memory device having a diode type current steering element in accordance with an embodiment of the invention.

FIG. 2B schematically illustrates a switching memory device 200 that contains a memory element 112 and a diode type current steering device 216 that preferentially allows current to flow through the memory device 200 in a forward direction ("I+"). However, due to the design of the current steering device 216, a reduced current can also flow in the opposing direction through the device by the application of a reverse bias to the electrodes 102 and 118.

Figure 2C:
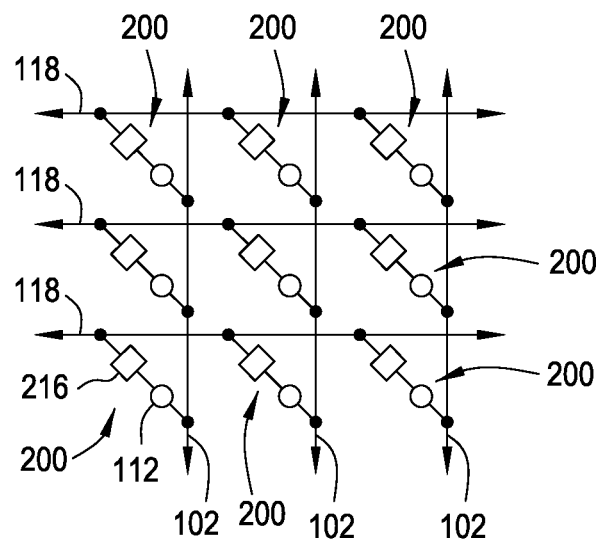
FIG. 2C is schematic representation of an array of memory devices in accordance with an embodiment of the invention.

FIG. 2C schematically illustrates an array of switching memory devices 200 that are connected together to form part of a high-capacity nonvolatile memory integrated circuit. Each of the individual switching memory devices 200 can be accessed using appropriate sets of discrete word-lines and bit-lines, which, as noted above, may comprise at least a portion of the electrodes 102 and 118. As illustrated in FIG. 2C, each of the switching memory devices 200 contains a memory element 112 and current steering device 216 (e.g., a diode type) that are connected to at least one of the electrodes 102 and at least one of the electrodes 118. The electrodes 102 and/or 118 are generally biased by circuitry that is connected at the periphery of the memory chip on which the array of memory devices 200 is formed.

Figure 2D:
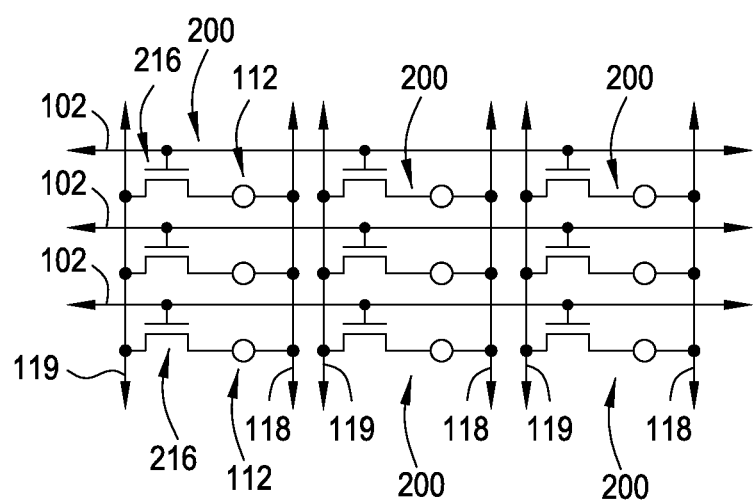
FIG. 2D is schematic representation of an array of memory devices in accordance with an embodiment of the invention.

FIG. 2D schematically illustrates another embodiment of an array of switching memory devices 200 that are connected together to form part of a high-capacity nonvolatile memory integrated circuit. As shown in FIG. 2D, the current steering device 216, such as a typical MOS type transistor, is used to selectively deliver current through the memory element 112 by use of the appropriate set of word-lines, bit-lines and separate source-lines 119. As illustrated in FIG. 2D, each of the switching memory devices 200 contains a memory element 112 and current steering device 216 (e.g., transistor) that are connected to at least one of the electrodes 102, at least one of the electrodes 118 and at least one of the source lines 119.

The source-lines 119 generally comprise one or more patterned conductive layers (e.g., metal) that are adapted to provide a desired amount of current to the memory element 112 when the transistor in the current steering device is turned "on." The electrodes 102, electrodes 118 and source-lines 119 are typically biased by circuitry that is connected at the periphery of the memory chip on which the array of memory devices 200 is formed.

During operation, such as a read operation, the state of a memory element 112 in the switching memory device 200 can be sensed by applying a sensing voltage (i.e., a "read" voltage $V_{READ}$ (FIG. 4A)), such as applying about +0.5 volts (V), to an appropriate set of electrodes 102 and 118. Depending on its history, a memory element that is addressed in this way may be in either a high resistance state (HRS) or a low resistance state (LRS).

Figure 4A:
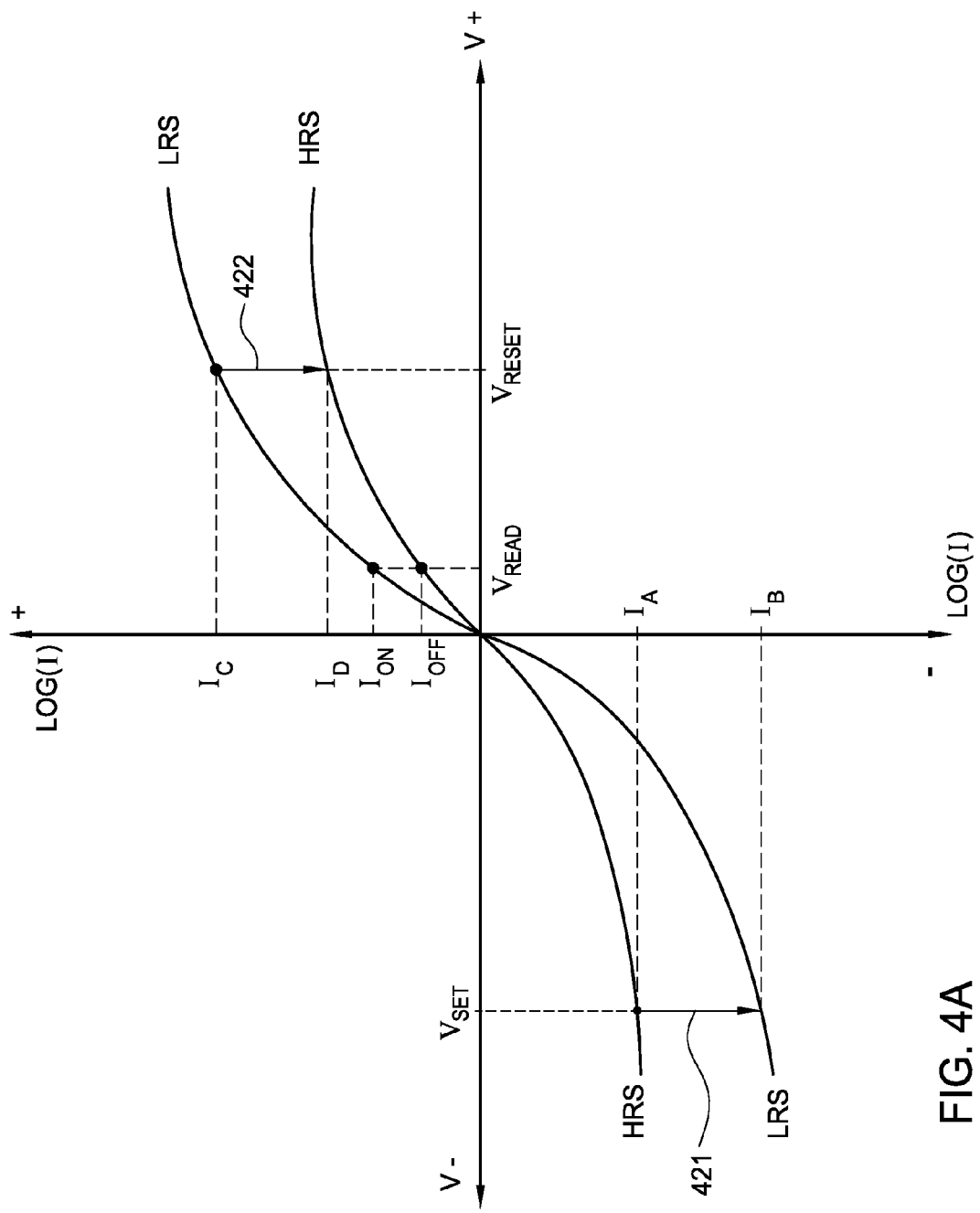
FIG. 4A is a graph illustrating the current (I) versus voltage (V) characteristics of the high and low resistance load lines of a variable resistance layer in accordance with an embodiment of the invention.

The resistance of the memory element 112 therefore determines what digital data is being stored by the memory element 112. If the memory element 112 is in the high resistance state, for example, the memory element may be said to contain a logic "zero" (i.e., a "0" bit). If, on the other hand, the memory element is in the low resistance state, the memory element may be said to contain a logic "one" (i.e., a "1" bit). During a write operation, the state of a memory element can be changed by application of suitable write signals to an appropriate set of electrodes 102 and 118.

in some embodiments, the memory element 112 uses bipolar switching where opposite polarity set and reset voltages are used to alter the resistance of the memory element between high and low resistance states. FIG. 4A schematically illustrates a log-log plot of current (I) versus voltage (V) of one example of high-resistant-state (HRS) and low-resistance-state (LRS) bipolar switching curves of a resistive switching type of memory element, and thus illustrates typical threshold values used to set and reset the contents of a memory element 112. In one example, initially, memory element 112 may be in a high resistance state (e.g., storing a logic "zero").

The high resistance state of memory element 112 can be sensed by read and write circuitry 150 (FIG. 2A) using electrodes 102 and 118. For example, read and write circuitry may apply a read voltage $V_{READ}$ to memory element 112, and can sense the resulting "off" current ($I_{OFF}$) that flows through memory element 112. When it is desired to store a logic "one" in memory element 112, memory element 112 can be placed into its low-resistance state. This may be accomplished by using read and write circuitry 150 to apply a set voltage $V_{SET}$ (e.g., −1 V to −4 V) across electrodes 102 and 118.

In one configuration, applying a negative $V_{SET}$ voltage to memory element 112 causes memory element 112 to switch to its low resistance state. It is believed that the change in the resistive state of memory element 112 may be due to the redistribution or filling of traps (i.e., "trap-mediated"), or defects, in the variable resistance layer 206 (FIG. 3A), when the device is reverse biased. The defects or traps, which are commonly formed during the deposition or initial burn-in or forming of the variable resistance layer 206, are often created by a non-stoichiometric material composition found in the formed variable resistance layer 206. $V_{SET}$ and $V_{RESET}$ are generally referred to as "switching voltages" herein.

The low resistance state of the memory element 112 can be sensed using the read and write circuitry 150. When a read voltage $V_{READ}$ is applied to resistive switching memory element 112, the read and write circuitry 150 will sense the relatively high "on" current value ($I_{ON}$), indicating that memory element 112 is in its low resistance state. When it is desired to store a logic "zero" in memory element 112, the memory element can once again be placed in its high resistance state by applying a positive reset voltage $V_{RESET}$ (e.g., +1 V to +5 V) to memory element 112.

When read and write circuitry applies $V_{RESET}$ to memory element 112, memory element 112 enters its high resistance state. When the reset voltage $V_{RESET}$ is removed from memory element 112, memory element 112 will once again be characterized by high resistance when the read voltage $V_{READ}$ is applied.

Voltage pulses can be used in the programming of the memory element 112. For example, a 1 microsecond (ms) to 1 nanosecond (ns) square or trapezoidal shaped pulse can be used to switch the memory element 112. In some embodiments, it may be desirable to adjust the length of the pulse depending on the amount of time needed to switch the memory element 112.

In one example, the "set" and "reset" pulses are each about 10 ns in length. Although the discussion of the memory element 112 herein primarily provides bipolar switching examples, some embodiments of the memory element 112 may use unipolar switching, where the set and reset voltages have the same polarity, without deviating from the scope of the invention described herein.

To provide a measurable difference between the logic "zero" and logic "one" states is common to form the variable resistance layer 206 and other memory element 112 components so that the $I_{ON}$ and $I_{OFF}$ currents have a difference of at least five times (e.g., current ratio $I_{ON}/I_{OFF} \geq 5$). In one example, the difference between the logic "zero" and logic "one" states is at least one order of magnitude (e.g., current ratio $I_{ON}/I_{OFF} \geq 10$).

In other words, the ratio of the electrical resistances of the variable resistance layer 206 is decreased by at least 5 to 10 times when switching from the high to the low resistance state. For example, the electrical resistance of the variable resistance layer 206 in the high resistance state is at least 5 to 10 times greater than the electrical resistance of the low resistance state when applying a $V_{READ}$ read voltage across electrodes 102 and 118 in the device.

In an effort to prepare the memory element 112 for use, it is common to apply a forming voltage ($V_{FORM}$) at least once across the electrodes 102, 118 to "burn-in" the device. It is believed that the application of a forming voltage, which is typically significantly greater than the $V_{RESET}$ and $V_{SET}$ voltages, causes the defects that are formed within the variable resistance layer 206 during the device fabrication process to move, align and/or collect within various regions of the formed layer, causing the variable resistance layer 206 to consistently and reliably switch between the "on" and "off" resistive states throughout the memory element's life.

In one configuration, the forming voltage is between about 1 and about 5 times greater than the $V_{RESET}$ or $V_{SET}$ voltage. In one example, the forming voltage is between about 1.4 and about 2.5 times greater than the $V_{RESET}$ or $V_{SET}$ voltage. In one example, the forming voltage is between about 3 and about 7 volts. However, in some cases it is desirable to form the memory element 112 so that the application of a forming voltage is not required at all to assure that the device will perform as desired throughout its life.

Figure 3B:
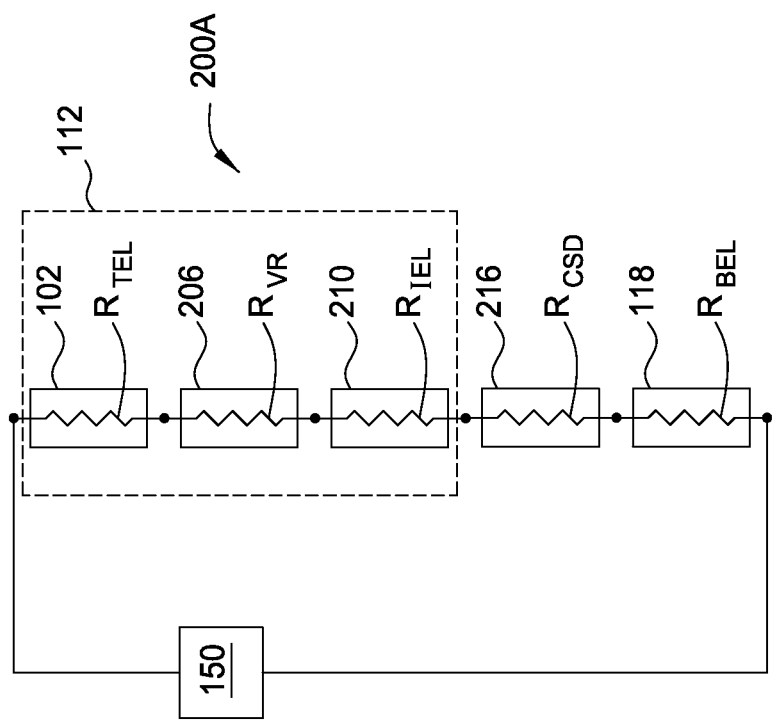
FIG. 3B is a schematic representation of an electrical circuit formed in the standard memory element illustrated in FIG. 3A.
Figure 3A:
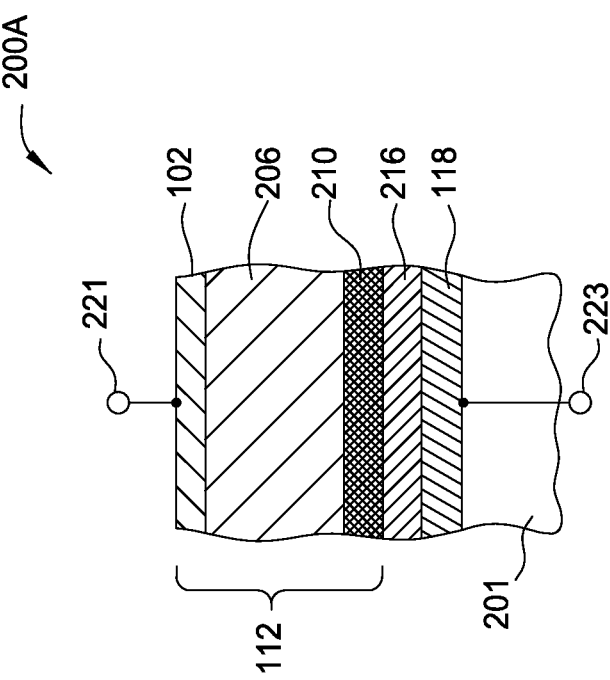
FIG. 3A is a schematic side cross-sectional view of a standard memory element disposed in a nonvolatile memory device.

FIG. 3A is a schematic side cross-sectional view of a standard un-optimized switching memory device 200A, which contains a memory element 112 and a current steering device 216 (e.g., a diode) that is formed over a substrate 201. In this configuration, the memory element 112 generally contains a top electrode 102, variable resistance layer 206 and intermediate electrode 210. FIG. 3B schematically illustrates an electrical circuit formed in the switching memory device 200A shown in FIG. 3A.

As illustrated in FIG. 3B, the electrical circuit within the standard switching memory device 200A includes a top electrode impedance (i.e., resistance $R_{TEL}$) created by the material layer(s) in the top electrode 102, a variable resistance layer impedance (i.e., resistance $R_{VR}$) created by the material layer(s) in the variable resistance layer 206, an intermediate electrode impedance (i.e., resistance $R_{IEL}$) created by the material layer(s) in the intermediate electrode 210, a current steering device impedance (i.e., resistance $R_{CSD}$) created by the material layer(s) in the current steering device 216 and a bottom electrode impedance (i.e., resistance $R_{BEL}$) created by the material layer(s) in the bottom electrode 118.

The electrodes 102, 210 and 118 are generally formed from a conductive material, such as a highly conductive semiconductor material (e.g., p-type polysilicon, n-type polysilicon) and/or metal (e.g., TiN, Al, W) to minimize the circuit resistance created between interconnected devices in a memory array 100. The variable resistance layer 206 can be a dielectric material, such as a metal oxide material or other similar material that can be switched between at least two or more stable resistive states. It is assumed that the contact resistances between the various layers in the switching memory device, such as the contact resistance formed between the electrode 102 and the variable resistance layer 206, are negligible to help reduce the complexity of the discussion of the circuit.

Although the current steering device 216 may include two or more layers of semiconductor material that are adapted to control the flow of current through the formed memory device 200A, the resistance of each of the components in the current steering device 216 are not individually discussed herein to minimize the complexity of the discussion, and thus an overall current steering device resistance $R_{CSD}$ is used to represent the overall impedance of the current steering device 216.

FIG. 4A schematically illustrates a log-log plot of current (I) versus voltage (V) of the low-resistance-state (LRS) and high-resistant-state (HRS) curves, or load lines, of a memory element 112 having these two bistable resistive states. As illustrated in FIG. 4A, by sweeping the voltage applied to the electrodes 102 and 118 between the $V_{SET}$ (e.g., −3 volts) and $V_{RESET}$ (e.g., +4 volts), while the device is in the low resistance state, the LRS curve can be created, and by sweeping the voltage applied to the electrodes 102 and 118 between the $V_{SET}$ and $V_{RESET}$, while the device is in the high resistance state, the HRS curve can be created. As noted above, depending on the physical and electrical characteristics of a formed variable resistance layer 206, it will switch from the HRS to the LRS during a "set" operation when a $V_{SET}$ is applied, and the variable resistance layer 206 will switch from the LRS to the HRS during a "reset" operation when a $V_{RESET}$ is applied.

Figure 4B:
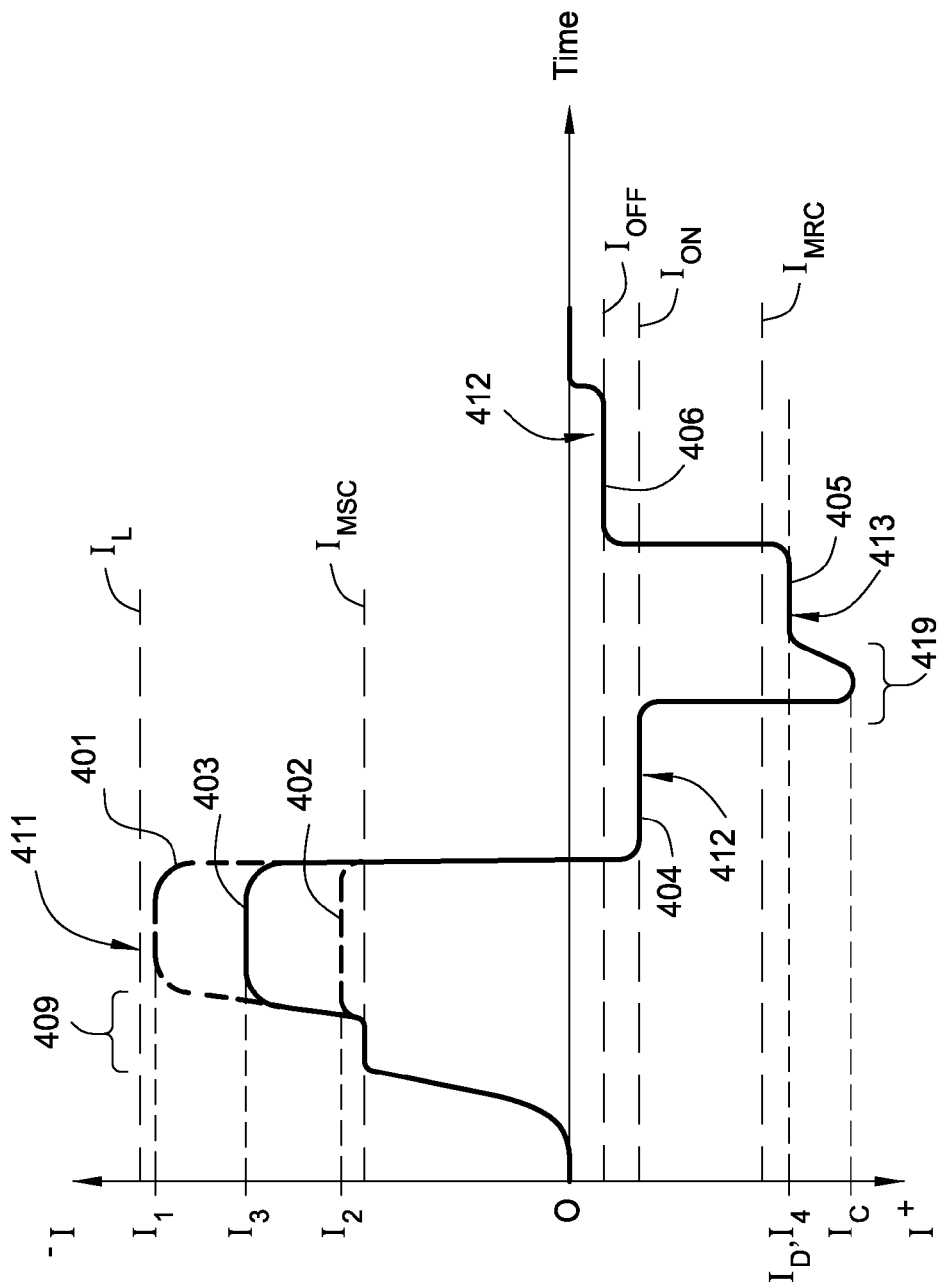
FIG. 4B is a current versus time plot illustrating the effect of delivering bipolar type switching pulses through a memory element in accordance with an embodiment of the invention.

FIG. 4B is a plot of current versus time for a plurality of bipolar type "set" and "reset" switching pulses, as illustrated by pulses 401-406, that are delivered to a switching memory device in accordance with an embodiment of the invention. In one example, as shown in FIG. 4B, a device programming step may include the delivery of a "set" switching pulse 411, a "reset" switching pulse 413, and two "sensing" pulses 412.

To assure that the memory element 112 reliably switches from a high resistance state to a low resistance state and vice versa, one must assure that the "set" switching pulse 411 produces a current that is greater than a minimum "set" current $I_{MSC}$, which is defined as the minimum current required to flow through the variable resistance layer 206 to cause it to switch from a high resistance state (e.g., 2.5 MΩ) to a low resistance state (e.g., <<250 kΩ). In one example, the high and low resistance states of the variable resistance layer 206 may be about 2.5 MΩ and about 100 kΩ, respectively.

Similarly, to assure that the memory element 112 reliably switches from a low to a high resistance state the "reset" switching pulse 413 will generally be delivered at a current level that is greater than a minimum "reset" current $I_{MRC}$, which is defined as the minimum current required to flow through the variable resistance layer 206 to cause it to switch from a low resistance state to a high resistance state.

The minimum "set" current $I_{MSC}$ and minimum "reset" current $I_{MRC}$ are related to the physical and/or electrical properties of the material in the variable resistance layer 206, and thus may be adjusted by careful selection of the material(s) and/or physical properties (e.g., thickness) of the variable resistance layer 206 and by performing various post-processing steps on the formed layer. In one example, by controlling the number of defects in the formed variable resistance layer 206, such as by adjusting the stoichiometry of the material(s) found in the variable resistance layer 206 (e.g., $HfO_{1.7}$ vs. $HfO_2$) during the layer formation process, the minimum switching currents can be adjusted.

Referring to FIG. 4A, in one example, when a "set" switching pulse 411 is delivered through the standard switching memory device 200A the switching memory device will switch from the high-resistance-state (HRS) to the low-resistance-state (LRS), as shown by the arrow 421. The current flowing through the switching memory device will shift from the initial "set" current $I_A$ to the final "set" current $I_B$ during the "set" operation, due to the change in resistance ($R_{VR}$) of the variable resistance layer 206. Also, the initial "set" current $I_A$ will typically equal the minimum "set" current $I_{MSC}$, discussed above.

Alternately, when a "reset" switching pulse 413 is delivered through the standard switching memory device 200A the switching memory device will switch from the low-resistance-state (LRS) to the high-resistance-state (HRS), as shown by the arrow 422. The current flowing through the switching memory device will shift from the initial "reset" current $I_C$ to the final "reset" current $I_D$ during the "reset" operation, due to the change in resistance ($R_{VR}$) of the variable resistance layer 206.

Referring to FIG. 4B, in one example, a "set" switching pulse 411, such as switching pulse 401, is delivered through the standard switching memory device 200A to create a low resistance state or logic "one" state. In this case, a set voltage $V_{SET}$ is applied across electrodes 102 and 118, which creates a first "set" current $I_1$ to flow through the standard switching memory device 200A, due to the impedance of the electrical components found in the memory element 200A.

The first "set" current $I_1$ is equal to the applied "set" voltage $V_{SET}$ divided by the sum of the impedances of the standard switching memory device 200A. Therefore, in one example, the first "set" current $I_1$ may equal the following:

$$I_1 = V_{SET}/(R_{TEL} + R_{VR} + R_{IEL} + R_{CSD} + R_{BEL}).$$

Because the most damage to the elements contained in the standard switching memory device 200A will generally occur when the largest current is delivered through the switching memory device, the pulse 411 schematically illustrated in FIG. 4B focuses on the later stages of the "set" operation, and thus the first "set" current $I_1$ achieved during the later stages of the "set" switching pulse 411 will generally equal the final "set" current $I_B$.

In general, the first "set" current $I_1$ will vary during the time that the "set" pulse 411 is applied across the electrodes 102 and 118. The first "set" current $I_1$ may have low current region 409 that is created due to the electrical properties of the material as it switches from the HRS to the LRS, and also have the final "set" current region as discussed above. Therefore, because the actual impedance of the electrodes is generally small, due to the need to reduce the power loss in the device, and the impedance of the variable resistance layer 206 is desirably low at the end of the "set" operation (e.g., $I_1 = I_B$) to achieve a logic "one" state the impedance of the current steering device will dominate the circuit (e.g., $R_{CSD} \gg R_{TEL} + R_{IEL} + R_{BEL} + R_{VR}$) and the impedance of the circuit in this state is approximately equal to the impedance of the current steering device (i.e., $R_{CSD}$).

Therefore, the magnitude of the set current $I_1$ created by the switching pulse 401 will equal the maximum current, or load current $I_L$ (FIG. 4B), which is approximately equal to the set voltage divided by the impedance of the current steering device (i.e., $I_1 = I_L = \sim V_{SET}/R_{CSD}$). The difference between the "set" current $I_1$ and the minimum $I_{MSC}$ current is much larger than necessary to cause the device to reliably switch to the logic "one" state. However, in practice it has been found that the high currents delivered through a standard type switching memory device 200A can permanently damage the memory element components and cause cross-talk to occur between adjacently connected memory devices.

The magnitude of the "set" current is particularly important for bipolar switching applications that require the current steering element 216 to be reverse biased to "set" the resistance of the memory element into a low resistance state. In this case, the act of driving a high current through the current steering device 216, in a non-forward direction, can breakdown, generate heat within and ultimately damage the material layers used to form the current steering element 216 and memory element 112, which will reduce the current steering element's and/or memory element's effective lifetime.

Because the current steering device 216 provides the primary voltage drop in the standard switching memory device 200A during the "set" operation (e.g., switch to "on" state), the current steering device 216 often is required to operate near its breakdown voltage to reliably cause the variable resistance layer 206 to switch. The application of the current steering device 216 in this regime will cause its impedance to drop over time due to damage to the materials in the formed layer. Typically the resistance ($R_{CSD}$) of an undamaged reverse biased diode type current steering device, for example, may be in a range between about 1 and about 100 mega-ohms (MΩ), whereas the resistance of a forward biased diode type current steering device may be between about 1 and about 20 kilo-ohms (kΩ).

Therefore, after performing the "set" operation by applying the "set" switching pulse 411, it is common to apply a "sensing" pulse 412 to assure that the logic "one" state has been achieved. The application of a sensing pulse 412, such as sensing pulse 404 in FIG. 4B, is generally performed by applying a $V_{READ}$ voltage (e.g., +0.5V) across the electrodes 102, 118.

If the "set" operation was performed correctly, the current through a standard switching memory device 200A during this sensing step will equal the $I_{ON}$ current, which equals the $V_{READ}$ voltage divided by the impedance of the circuit. For a standard switching memory device 200A that has a variable resistance layer 206 that is in a low resistance state, the $I_{ON}$ current will approximately equal to the $V_{READ}$ voltage divided by the impedance of the current steering device (e.g., $I_{ON} = \sim V_{READ}/R_{CSD}$).

Next, in cases where it desirable to change the memory element 112 from a low resistance state (i.e., logic "one" state) to a high resistance state (i.e., logic "zero" state) a "reset" switching pulse 413, such as reset switching pulse 405, is delivered through the standard switching memory device 200A. The largest current that is delivered through the switching memory device during the "reset" operation will be achieved when the initial "reset" current $I_C$ flows through the device.

The current flowing through the device during the "reset" operation will then tend to drop as the variable resistance layer 206 switches from a LRS to a HRS. Therefore, the pulse 413, which is schematically illustrated in FIG. 4B, may have a high current portion 419 at the start of the delivered pulse 413 and a stable region that equals the "reset" current $I_4$ during the later stages of the "reset" operation. Thus, the "reset" current $I_4$ achieved during the "reset" switching pulse 413 will generally equal the final "reset" current $I_D$ and the maximum current achieved during the pulse 413 will equal the initial "reset" current $I_C$.

The magnitude of the current required to switch the memory element 112 to a high resistance state from a low resistance state depends on the magnitude of the current used to "set" the device in the low resistance state. If a high "set" current, such as current $I_1$, is delivered to the memory element 112, then a higher "reset" current is required to achieve a desirable high resistance state.

Stated another way, the difference between the initial "reset" current $I_C$, and/or the final "reset" current $I_D$, and the minimum "reset" current $I_{MRC}$ current needs to be larger than necessary to cause the device to switch from the "on" to the "off" state if the magnitude of the prior applied "set" current is too far from the minimum "set" current $I_{MSC}$. The larger than necessary swings in the current used to switch between the "on" and "off" states can damage the materials and components in the switching memory device, thus affecting the memory element's lifetime and reliability.

Next, after delivering the "reset" switching pulse 413 it is common to apply a "sensing" pulse 412, such as sensing pulse 406 in FIG. 4B, to assure that the logic "zero" state has been achieved. The sensing pulse 412 is generally performed by applying a $V_{READ}$ voltage (e.g., +0.5V) across the electrodes 102, 118. If a "reset" operation was performed correctly, the current through a standard switching memory device 200A during this sensing step will equal the $I_{OFF}$ current, which for the standard switching memory device 200A will equal to the $V_{READ}$ voltage divided by the sum of the current steering device impedance resistance ($R_{CSD}$) and the resistance of the variable layer ($R_{VR}$). Therefore, in one example, the $I_{OFF}$ current for the standard memory device 200A will be as follows:

$$I_{OFF} = \sim V_{READ}/(R_{CSD}+R_{VR})$$

Figure 5B:
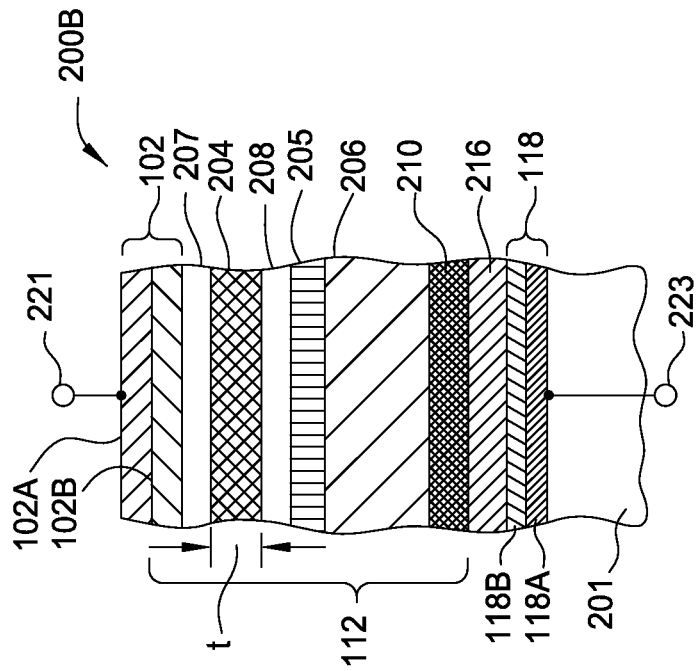
FIG. 5B is a schematic side cross-sectional view of a memory element disposed in a nonvolatile memory device in accordance with a further embodiment of the invention.
Figure 5A:
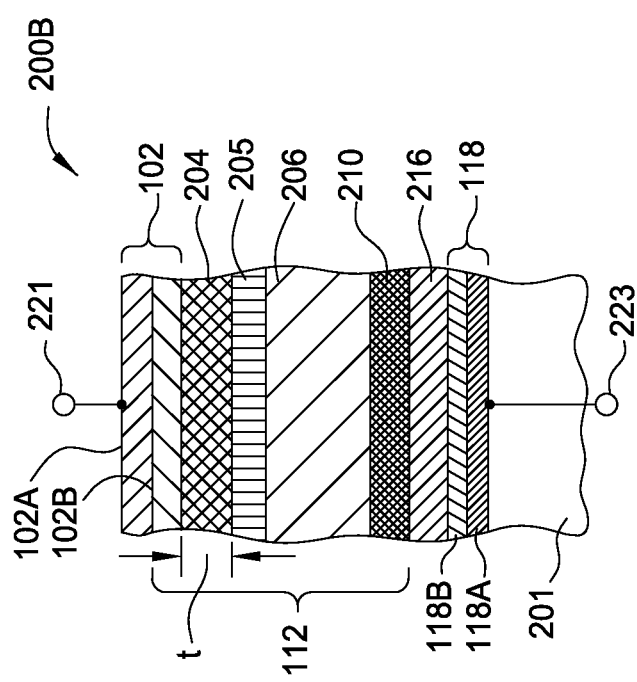
FIG. 5A is a schematic side cross-sectional view of a memory element disposed in a nonvolatile memory device in accordance with an embodiment of the invention.

FIG. 5A is a schematic side cross-sectional view of some embodiments of an improved switching memory device 200B that contains a memory element 112 and a current steering device 216 that are disposed between electrodes 102 and 118 and are formed over a portion of a substrate 201. The switching memory device 200B contains a current limiting component, such as current limiting layer 204 that is configured to improve the device's switching performance and lifetime. In this configuration, the memory element 112 will generally contain a top electrode 102, a current limiting layer 204, a variable resistance layer 206 and an optional intermediate electrode 210, or additional conductive layer.

In some embodiments, the current limiting layer 204 is disposed within the improved switching memory device 200B close to the variable resistance layer 206 and/or current steering device 216 to effectively limit or prevent the propagating programming current pulses (e.g., "set" or "reset" pulses) delivered through the switching memory device 200B from damaging the layers formed therein during normal device operation. Positioning the current limiting layer 204 near the variable resistance layer 206 and/or current steering device 216 can be important in switching memory devices 200B that utilize high speed transient programming pulses, such as square or trapezoidal shaped pulses that are less than about 1 ms in length.

It is believed that the use of an externally positioned resistive element in a circuit in which the switching memory device 200B is formed, such as resistive layers or structures formed on other parts of the chip in which the switching memory device 200B is formed, will not effectively prevent the delivered high speed programming pulse energy from causing the materials in the variable resistance layer 206 and/or current steering device 216 from breaking down when the high speed transient programming pulses are delivered through the switching memory device 200B.

It is believed that the propagation delay created by the transmission of the high speed programming pulse through the length of the electrical circuit formed between the external resistive element and the switching memory device 200B components (e.g., variable resistance layer 206 and current steering device 216) will generally prevent the externally positioned resistive element from effectively reducing or dropping the instantaneous amount of energy passing through the variable resistance layer 206 and current steering device 216 as the high speed programming pulse passes through the switching memory device 200B in the forward and/or reverse bias directions.

In some embodiments, the current limiting layer 204 is disposed in close proximity to the variable resistance layer 206, such as substantially adjacent to the variable resistance layer 206 with a separation layer 205 between the current limiting layer 204 and the variable resistance layer 206. The position of the current limiting layer 204 in the switching memory devices 200B need not be limited to the position shown in FIG. 5A, and thus the configuration as shown is not intended to be limiting as to the scope of the invention described herein.

In some embodiments, the current limiting layer 204 is disposed between the variable resistance layer 206 and the current steering device 216. In some embodiments, the current limiting layer 204 can be placed between any adjacently positioned layers in the formed switching memory device 200B, such between the intermediate electrode 210 and the variable resistance layer 206 or between the intermediate electrode 210 and the current steering layer 216.

In some embodiments, as illustrated in FIG. 5A, the electrodes 102 and 118 may each comprise more than one layer of conductive material. In one configuration, the top electrode 102 may comprise a first conductive layer 102A and a second conductive layer 102B, and the bottom electrode 118 may comprise a first conductive layer 118A and a second conductive layer 118B. In this case, the first conductive layer 102A in the top electrode 102 and the first conductive layer 118A in the bottom electrode 118 can be used to interconnect multiple switching memory devices 200B in an array of formed devices, and thus may act as word-lines or bit-lines.

The second conductive layer 102B and the second conductive layer 118B may each comprise a material that has desirable electrical properties (e.g., work function) so that these layers can help improve the electrical characteristics of the memory element 200B. The first conductive layer 102A and/or first conductive layer 118A may comprise, for example, tungsten (W), aluminum (Al) or copper (Cu), whereas the second conductive layer 102B and/or the second conductive layer 118B may comprise, for example, titanium (Ti), titanium nitride (TiN), or doped poly-silicon.

The configuration shown in FIG. 5A and discussed herein is not intended to limit the scope of the invention described herein, because, for example, the electrodes 102 and 118 may comprise a single conductive layer, and the position of the various layers, or number of layers, in the stack of layers used to form switching memory device may be altered without deviating from the basic scope of the invention described herein.

FIG. 5B is a schematic side cross-sectional view of another embodiment of an improved switching memory device 200B as previously shown in FIG. 5A with additional and optional stabilizing layers 207 and 208 disposed on both sides of the current limiting layer 204 and between the separation layer 205 and the top electrode 102. The stabilizing layers may comprise a conductive oxide for example indium tin oxide (ITO) or iridium oxide (IrOx), or Indium Zinc Oxide (IZO).

Figure 5C:
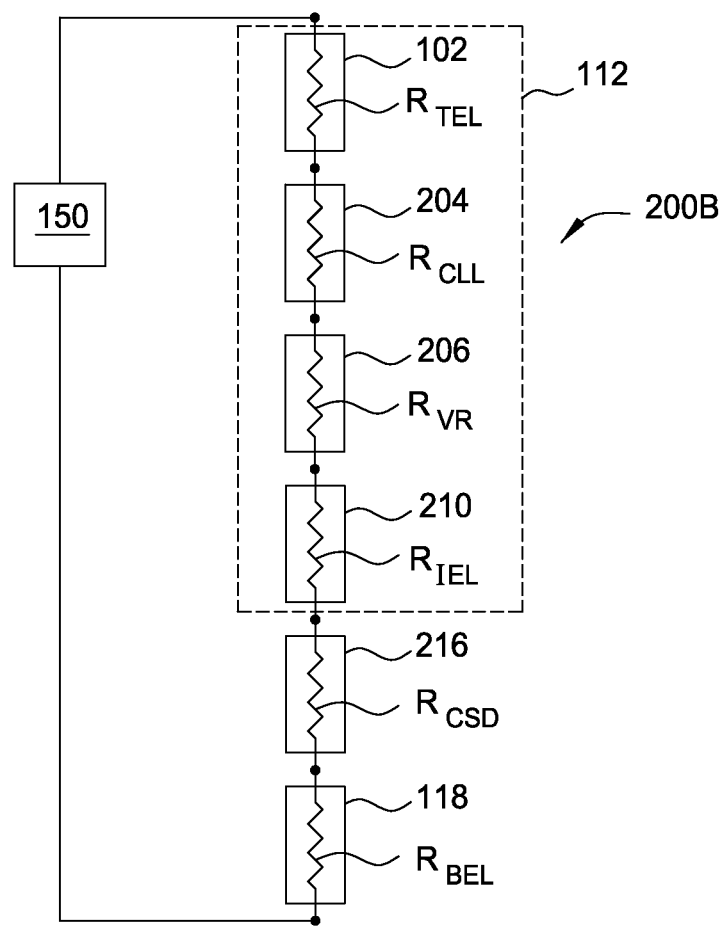
FIG. 5C is a schematic representation of an electrical circuit formed in the memory element illustrated in FIG. 5A and FIG. 5B in accordance with an embodiment of the invention.

FIG. 5C schematically illustrates an electrical circuit formed by the switching memory device 200B shown in FIG. 5A. As illustrated in FIG. 5C, the electrical circuit within the switching memory device 200B includes a top electrode impedance (i.e., resistance $R_{TEL}$) created by the top electrode 102 layer(s), a current limiting layer impedance (i.e., resistance $R_{CLL}$) created by the current limiting layer 204, a variable resistance layer impedance (i.e., resistance $R_{VR}$) created by the variable resistance layer 206, an intermediate electrode impedance (i.e., resistance $R_{IEL}$) created by the intermediate electrode 210 layer(s), a current steering device impedance (i.e., resistance $R_{CSD}$) created by the current steering device 206 and a bottom electrode impedance (i.e., resistance $R_{BEL}$) created by the bottom electrode 118 layer(s).

Referring back to FIG. 4B, in one example, a "set" switching pulse 411, or set pulse 403, is delivered through the switching memory device 200B to create a low resistance state, or logic "one" state. In this configuration, a "set" voltage $V_{SET}$ is applied across electrodes 102 and 118, which creates a set current $I_3$ to flow through the switching memory device 200B, due to the impedance of the components in the switching memory device 200B.

The set current $I_3$ will equal the $V_{SET}$ voltage divided by the sum of the impedances in the switching memory device 200B. Therefore, in one example, the set current $I_3$ will equal the following:

$$I_3 = V_{SET}/(R_{TEL} + R_{CLL} + R_{VR} + R_{IEL} + R_{CSD} + R_{BEL}).$$

Therefore, because the impedance of the electrodes is generally small, due to the need to reduce the power loss in the device, and the impedance of the variable resistance layer is desirably low to achieve a logic "one" state, the impedance of the current steering device and the current limiting layer will dominate the circuit (e.g., $(R_{CLL} + R_{CSD^*}) \gg R_{TEL} + R_{IEL} + R_{BEL} + R_{VR}$) and the impedance of the circuit in this state is effectively equal to the sum of the impedances of the current steering device and the current limiting layer (i.e., $R_{CLL} + R_{CSD}$).

Therefore, referring to FIG. 4B, the magnitude of the set current $I_3$ created by a "set" pulse 403 will equal a current ($I_3$), which can be adjusted by the selection of a desired fixed impedance value of the current limiting layer 204. Due to the presence of the added impedance ($R_{CLL}$) of the current limiting layer 204 in the switching memory device 200B, versus the standard switching memory device 200A (FIG. 3A), the actual impedance ($R_{CSD^*}$) of the current steering device 216 will generally be greater than the impedance of a current steering device 216 disposed in the standard current steering device 200A, because the added voltage drop of the current limiting layer 204 in the device circuit will prevent the current steering device 216 from being damaged by the application of the programming currents during normal operation.

As noted above, because the current steering device 216 in a standard switching memory device 200A (FIG. 3A) is the primary voltage drop during the "set" operation (e.g., switch to "on" state), the current steering device 216 often is required to operate near its breakdown voltage to reliably cause the variable resistance layer 206 to switch, which will generally not be the case in the switching memory device 200B due to the added voltage drop provided by the current limiting layer 204.

The addition of the current limiting layer 204 in the switching memory device 200B reduces the voltage applied across the current steering device 216, and thus prevents the impedance of the current steering device 216 from dropping due to the application of a voltage near the breakdown state of the material and/or degrading over time due to damage created by the repetitive application of the programming voltages.

Referring to FIG. 4B, in general, it is desirable to form the current limiting layer 204 so that its impedance ($R_{CLL}$) limits the current through the memory element 112 to a value (e.g., current $I_2$) that is just greater than the minimum "set" current $I_{MSC}$, as illustrated by pulse 402, and still allow the "on" logic state to be reliably "set" by the applied $V_{SET}$ voltage.

It is believed that by adding the current limiting layer 204 to a memory element 112 can also help reduce the apparent minimum $I_{MSC}$ current required to cause the variable resistance layer 206 to change to a low resistive state, because the addition of the current limiting layer impedance ($R_{CLL}$) in the circuit will reduce the swing in current between the "set" and "reset" switching currents at the same fixed applied voltage, thus affecting the density and movement of the traps in the variable resistance layer 206.

Not intending to be bound by theory, it is believed that when a smaller "on" state switching current is applied to a device that the formed filament(s), or aligned traps, in the variable resistance layer will be smaller in size than if a higher "on" current is applied, thus making the filament(s) easier to alter during the "reset" phase of the resistive switching process.

In some embodiments, it is desirable to form the current limiting layer 204 from a material that will not significantly vary in resistance when the "set" and "reset" switching currents are applied to the switching memory device 200B. Forming the current limiting layer 204 from a material that has a generally constant resistance will assure that the switching characteristics of the device will not change over the life of the switching memory device 200B, due to changes in the material in the formed layer.

Also, forming the current limiting layer 204 from a material that does not vary in resistance during the programming steps, due to the use of a non-resistive switching material, has many advantages that include: 1) less variability in the electrical properties of the formed layer due to variations in the deposition process (e.g., defect density variations); 2) less variability in the electrical properties of the formed layer over the lifetime of the formed memory device due to any physical or chemical change in the current limiting layer material; and 3) a lower device performance variability that is created by differences in the "forming" process (i.e., application of the forming voltage ($V_{FORM}$)). It is desirable to form the current limiting layer 204 so that its material and electrical properties will not degrade or breakdown during the "forming" process, and also during normal repetitive operation of the switching memory device 200B.

Device Structure and Formation Processes

In one embodiment, as discussed above, a memory array 100 (FIG. 1) comprises a plurality of switching memory devices 200B that are each interconnected by the electrodes 102 and 108. As illustrated in FIG. 5A, a switching memory device 200B may comprise a top electrode 102, a current limiting layer 204, a separation layer 205, a variable resistance layer 206, an intermediate electrode 210, a current steering device 216 and an electrode 118. In one configuration, as noted above, the current steering device 216 comprises a p-n junction diode, p-i-n diode, transistor, or other similar device that is disposed between electrode 102 and memory element 112, or between the electrode 118 and memory element 112.

In one example, the current steering device 216 may include two or more layers of a semiconductor material, such as two or more doped silicon layers, that are configured to direct the flow of current through the device. In one example, the current steering device is a diode that comprises a p-doped silicon layer (not shown), an un-doped intrinsic layer (not shown), and an n-doped silicon layer (not shown) that has an overall resistance between about 1 kΩ and about 100 MΩ. The overall resistance will generally depend on the type of current steering device that is formed and in what direction current is flowing through the device (e.g., forward or reversed biased)

The electrodes 102, 210 and 118 disposed in the switching memory device 200B are generally formed from a conductive material that has a desirable conductivity and work function. In some configurations, the electrode 102, 210 and/or 118 disposed in the switching memory device 200B are each formed from different materials, which may include, but are not limited to p-type polysilicon, n-type polysilicon, transition metals, transition metal alloys, transition metal nitrides, and transition metal carbides.

In one example, the electrode 102 and the electrode 118 comprise a metal, metal alloy, metal nitride or metal carbide formed from an element selected from a group consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combination thereof. In one example, the electrodes 102 and 118 comprise a metal alloy selected from the group of a titanium/aluminum alloy, or a silicon-doped aluminum (AlSi).

In some embodiments of the switching memory devices 200B, the electrodes 102 and 118 comprise a metal, such as a transition metal, transition metal alloy, transition metal carbide, transition metal nitride (e.g., TiN), non-mobile metal such as gold (Au) or platinum (Pt), and the intermediate electrode 210 comprises a heavily doped semiconductor material, such as a heavily doped silicon material (e.g., n-type polysilicon material) that interfaces well with the current steering device 216. In one example, the intermediate electrode 210 comprises polysilicon and is between about 50 Å and about 500 Å thick, and the electrodes 102 and 118 are between about 50 Å and 5000 Å thick and comprise a metal, such as titanium nitride (TiN).

The variable resistance layer 206 disposed in a switching memory device 200B can be a dielectric material, such as a metal oxide material or other similar material that can be switched between at least two or more stable resistive states. In some embodiments, the variable resistance layer 206 is a high bandgap material (e.g., bandgap >4 electron volts (eVs)), such as hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$).

Using high band gap variable resistance layer materials improves data retention in the memory element 112, and reduces the leakage current in the formed memory element device, because the amount of trapped charge in the variable resistance layer material will be less than a lower band gap material, and the high band gap materials create a large barrier height that the carriers have to cross during the read, set and reset operations. In other embodiments, lower bandgap metal oxide materials can be used, such as titanium oxide ($TiO_x$), nickel oxide ($NiO$)$_x$ or cerium oxide ($CeO_x$) may be advantageous for some embodiments.

In some cases, a semiconductive metal oxide (p-type or n-type) such as zinc oxides ($Zn_xO_y$), copper oxides ($Cu_xO_y$), and their nonstoichiometric and doped variants can be used. The variable resistance layer 206 may comprise a metal oxide (e.g., $HfO_2$) layer formed to a thickness of between about 10 Å and about 100 Å. In one configuration, the variable resistance layer 206 is doped with a material that has an affinity for oxygen (e.g., transition metals (Al, Ti, Zr)) to form a metal-rich variable resistance layer (e.g., $HfO_{1.7}$ vs. $HfO_2$), which is deficient in oxygen, and thus has a larger number of oxygen vacancy type defects.

The additional vacancy defects can reduce the required switching and forming voltages, reduce the device operating current(s), and reduce the device to device variation in a formed memory element. In one example, the variable resistance layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, formed to a thickness of between about 20 Å and about 100 Å, such as between about 30 Å and about 50 Å. The variable resistance layer 206 can be deposited using any desired technique, but in some embodiments described herein is deposited using an ALD process.

In other embodiments, the variable resistance layer 206 can be deposited using a CVD (e.g., LPCVD, PECVD) or ALD (e.g., PEALD), physical vapor deposition (PVD), liquid deposition processes, and epitaxy processes. It is believed that PEALD processes can be used to control defects and improve switching and forming voltages in some embodiments. In one example, an ALD process using tetrakis(dimethylamino)hafnium (TDMAH) and an oxygen containing precursor at a temperature of about 250° C. is used to form an 50 Å thick hafnium oxide ($Hf_xO_y$) containing variable resistance layer 206.

In some embodiments, the current limiting layer 204 comprises a varistor that can be reliably and consistently formed within the switching memory devices 200B. In one configuration of the memory element 112, the formed varistor type current limiting layer 204 creates a barrier that is used to adjust the ease with which current will flow through the formed device when a voltage is applied across the electrodes.

The added barrier to current flow will tend to reduce the magnitude of the $I_{ON}$ and $I_{OFF}$ current that flow through the device during operation, due to the increased energy required to move the electrons through the varistor layer. A varistor layer comprises a dielectric layer that effectively has a non-linear current versus voltage (I-V) curve, due to its low electrical conductivity at low values of electric field. At higher field values, individual grains of the varistor material break down and start conducting current along their boundaries, leading to current flow.

To achieve a current limiting layer that has desirable electrical and/or physical properties, one or more steps in a current limiting layer 204 deposition process can be adjusted to form a varistor layer that has desirable properties. As discussed above, in some cases it is desirable to adjust the resistance of the current limiting layer 204, so that it matches the resistance of the formed current steering device 216 in the formed switching memory device 200B. One skilled in the art will appreciate that the resistance (R) to current flow through the varistor layer can be adjusted by varying the thickness, material composition (i.e., doping levels), grain size, or crystalline structure.

Because the cross-sectional area (A) of the device is generally fixed by the size and lateral spacing of the switching memory devices 200B, and thus is generally not easily varied from one switching memory device to the next, the resistance R of the current limiting layer 204 can be controlled by the adjustment of the thickness "t" (FIGS. 5A, 5B) and the grain size 'd.' Typical deposition processes may include ALD, PVD and CVD processes that can be tailored to adjust the electrical properties and thickness of the deposited current limiting layer 204.

In one example, for a memory element 112 that is about 150 nm×150 nm in size, a current limiting layer 204 that is about 50 Å thick, and has an equivalent resistivity of 500Ω-cm will achieve a resistance of about 1 MΩ, to match the resistance found in a current steering device that has a resistance of about 1 MΩ. In another example, the current limiting layer 204 is formed so that its impedance ($R_{CLL}$) is between about 10 kΩ and about 10 MΩ, such as between about 100 kΩ and about 1 MΩ.

The specific thickness would be determined from its process-dependent grain size and desired operating voltage by the relationship shown in Eqn. 1:

$$V_B = tv_g/d \qquad \text{Eqn. 1}$$

Where $V_B$ is the breakdown voltage desired across the varistor (this should be between $V_{SENSE}$ and the lower of the magnitude of $V_{SET}$ and $V_{RESET}$), t is the thickness of the varistor film, d is the varistor material grain size, and $v_g$ is the breakdown voltage per intragranular barrier (typically 3.2 V/grain in thin films). This relationship self-consistently determines the relationship between process (which decides grain size), design (such as film thickness), and application (such as $V_{READ}$, $V_{SET}$, and $V_{RESET}$).

Materials used to form the varistor type current limiting layer 204 include various dielectric materials that generally include various metal oxides. In one configuration, the current limiting layer 204 includes a varistor that has a breakdown voltage that exceeds the breakdown voltage of the variable resistance layer 206. Current limiting layer 204 materials that have a breakdown voltage that is less than the breakdown voltage of variable resistance layer 206 material will become damaged during application of the forming voltage ($V_{FORM}$), which is discussed above.

Therefore, in some embodiments of the invention, the material in a formed current limiting layer 204 disposed in a formed memory element 112 has a breakdown voltage that is greater than the breakdown voltage of the material found in the variable resistance layer 206. In one example, the current limiting layer 204 comprises a zinc oxide ($ZnO_x$) layer doped with bismuth, cobalt, or manganese that is formed using a PVD, CVD or ALD type process. In some configurations, the composition of the metal containing layer can be adjusted to change the resistivity of the formed layer. In some deposition processes, the resistivity of the formed oxygen containing layer is controlled by adjusting the partial pressure of oxygen in the processing region of the deposition chamber during a CVD, PVD, or ALD deposition process.

The use of varistor layers as described above, when used in series with the variable resistance layer 206 acts as a current limiting element that will reduce leakage. However, when the varistor layer is formed so that it is in direct contact with the variable resistance layer 206, the process of forming the varistor layer can contaminate the variable resistance layer 206, and thus degrade the performance of the device. To prevent the formed varistor layer or other subsequent processing from damaging the interface or properties of variable resistance layer 206, a separation layer 205 can be used as a contamination barrier layer and prevent the diffusion of the components used to form the varistor layer into the variable resistance layer 206.

It is generally desirable to form the current limiting layer 204 so that its material and electrical properties will not degrade or breakdown during the often high current "burn-in" type device preparation steps, such as the "electrical forming" process, and also during normal repetitive operation of the nonvolatile resistive switching memory device. However, in some device operation regimes certain varistor layers may still be susceptible to breakdown during forming and thus tend to degrade (e.g., current leakage) during the application of normal operation currents, and thus causing its resistivity to vary over time.

In some embodiments, by positioning one or more stabilizing layers, 207, 208, on either side of the varistor layer, the breakdown of the current limiting layer 204 can be reduced. The stabilizing layers generally comprise indium tin oxide (ITO) and iridium oxide ($IrO_x$) and indium zinc oxide (IZO). It is believed that the mobile oxygen in the stabilizing layers can be used to replenish the oxygen atoms in the varistor layer that are undesirably moved during the application of forming a bias during the forming process.

The replenishment of the oxygen atoms to the vacancies formed in the varistor layer during the forming process can assist in maintaining the stoichiometry of the tunnel oxide material and thus preventing device degradation during the forming process. Furthermore, thermal considerations during the normal switching operation can create additional oxygen vacancies in the current limiting layer 204 while the presence of the stabilizing layers can offset this effect, by maintaining the electrical properties of the varistor layer material, and extending the operational life of the nonvolatile resistive switching memory device.

Switching Memory Device Fabrication Processes

Figure 6:
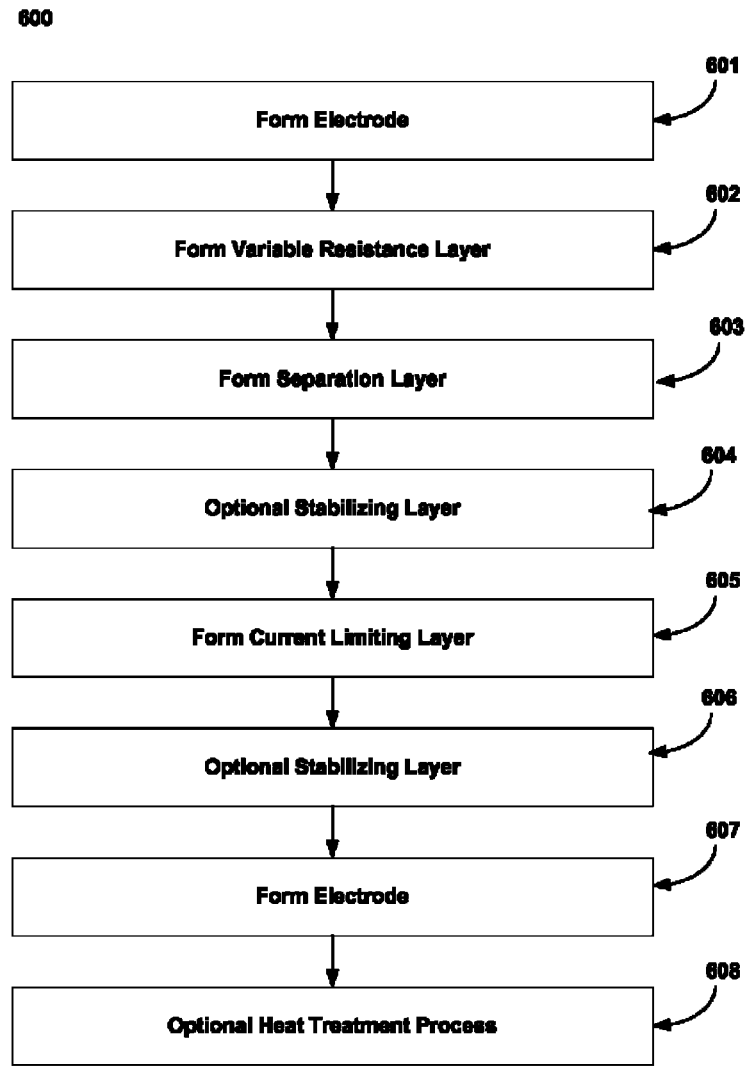
FIG. 6 is a schematic depiction of a process for forming the switching memory device according to some embodiments of the invention.

FIG. 6 illustrates a process sequence 600 that can be used to form a memory element 112 components in a switching memory device 200B illustrated in FIGS. 5A & 5B, according to embodiments of the invention. Although omitted from the discussion below, the electrode 118 and current steering device 216 elements can be formed over a portion of a substrate 201, such as a silicon substrate, by use of a physical vapor deposition (PVD), chemical vapor deposition (CVD), atomic layer deposition (ALD), or other similar process that is well known in the art.

In some configurations, it is desirable to determine the empirical or theoretical resistance of the current steering device 216 structure in the memory element 112, so that the resistance of the current limiting layer 204 can be adjusted relative to the expected resistance of the formed current steering device 216. In one example, the current steering device 216 is a diode that comprises a p-doped silicon layer (not shown) that is formed by a CVD process, an un-doped intrinsic layer (not shown) that is formed by an CVD process, and an n-doped silicon layer (not shown) that is formed by a CVD process. In one example, the electrode 118 comprises a layer of titanium nitride (TiN) that is between about 500 Å and 1 μm thick and is formed by use of a PVD process.

Referring to FIGS. 5A and 6, at step 601 an intermediate electrode 210 is formed over a substrate 201. In one embodiment, the intermediate electrode 210 is a highly doped polysilicon layer that is formed using a conventional CVD or ALD type polysilicon deposition technique. In some cases, an optional native oxide layer removal step may be performed after forming the intermediate electrode layer 210 by use of a wet chemical processing technique, or conventional dry clean process that is performed in a plasma processing chamber. In one example, the intermediate electrode 210 comprises polysilicon that is between about 50 Å and about 5000 Å thick, which is formed by use of a CVD or ALD polysilicon deposition process.

Referring to FIGS. 5A and 6, at step 602, the variable resistance layer 206 is deposited over the intermediate electrode 210 using a PVD, CVD or ALD deposition process. The variable resistance layer 206 may comprise a metal oxide layer, such as $Hf_xO_y$, $Ta_xO_y$, $Al_xO_y$, $La_xO_y$, $Y_xO_y$, $Dy_xO_y$, $Yb_xO_y$, and/or $Zr_xO_y$, formed to a thickness of between about 20 Å and about 100 Å, such as between about 30 Å and about 50 Å.

The variable resistance layer 206 can be deposited using any desired technique, but in some embodiments described herein is deposited using an ALD process. In one example, an ALD process using tetrakis(dimethylamino)hafnium (TDMAH) and an oxygen containing precursor (e.g., water vapor) at a temperature of about 250° C. is used to form a 30 Å thick hafnium oxide ($Hf_xO_y$) which acts as the variable resistance layer 206.

At step 603, as depicted in FIGS. 5A and 6, a separation layer 205 is formed over the variable resistance layer 206 as shown in FIG. 5A. In one example, the separation layer 205 may comprise titanium nitride (TiN) or tantalum nitride (TaN). The separation layer 205 may be deposited using a deposition process, such as PVD, CVD, ALD or other similar process. In one example, the separation layer 205 is between about 30 Å and 100 Å thick. In one example, a PVD process is used to form a separation layer 205 that comprises titanium nitride (TiN) that is between about 30 Å and 1000 Å thick.

Optionally at step 604, as depicted in FIGS. 5B and 6, a stabilizing layer 208 may be formed over the separation layer 205. In one example, the stabilizing layer 208 may comprise indium tin oxide (ITO) or iridium oxide ($IrO_2$). The stabilizing layer 208 may be deposited using a deposition process, such as a PVD, CVD, ALD or other similar process. In one example, the stabilizing layer 208 is greater than or equal to 50 Å thick. In one example, the thickness range of the stabilizing layer 208 is between about 30 Å and 100 Å. In one example, a PVD process is used to form a stabilizing layer 208 that comprises indium tin oxide (ITO) and is between about 30 Å and 100 Å thick.

At step 605, as depicted in FIGS. 5A and 6, a current limiting layer 204 is formed using a deposition process, such as a PVD, CVD, ALD or other similar process. In some embodiments, the current limiting layer 204 is a varistor layer (e.g., doped $ZnO_x$), that is formed by use of a PVD, CVD or ALD process. In one example, the current limiting layer 204 may be formed to a thickness between about 50 Å and about 60 Å, and comprise a material such as $ZnO_x$ doped with at least one of bismuth, cobalt, or manganese.

In one example, the current limiting layer 204 layer is formed using a PVD process that deposits an doped $ZnO_x$ layer at a deposition rate of between about 0.1 to 1 Å/minute using a zinc target and maintaining the processing environment during the PVD deposition process to between about 10 and about 50% oxygen ($O_2$) and the balance being argon (Ar) gas. The dopants can be incorporated into the target or may be co-sputtered from a separate target.

Maintaining the oxygen concentration in a PVD processing environment to a concentration of greater than about 10% will form a dielectric layer. Therefore, one can adjust the layer thickness and resistivity to form a zinc oxide layer containing current limiting layer 204 that has a desirable resistance. In one process example, the oxygen concentration in the processing environment during deposition is controlled to form a zinc oxide ($ZnO_x$) layer that has a desirable thin-film resistivity within a range of 100-10,000 Ohm-cm.

Optionally at step 606, as depicted in FIGS. 5B and 6, a stabilizing layer 207 may be formed over the current limiting layer 204 comprising indium tin oxide (ITO) or iridium oxide ($IrO_2$) or IZO. The stabilizing layer 207 may be deposited using a deposition process, such as a PVD, CVD, ALD or other similar process. In one example, the stabilizing layer 207 has a thickness greater than or equal to 50 Å. In one example, a thickness range between about 30 Å and 1000 Å. In one example, a PVD process is used to form a stabilizing layer 208 that comprises indium tin oxide (ITO) and is between about 30 Å and 1000 Å thick.

At step 607, the electrode 102 is formed over the current limiting layer 204 as shown in FIG. 5A or optionally over the stabilizing layer as shown in FIG. 5B, using one or more of the materials that are discussed above. The electrode layer 102 may be deposited using a deposition process, such as a PVD, CVD, ALD or other similar process. In one example, the electrode layer 102 is between about 100 Å and 1000 Å thick. In one example, a PVD process is used to form an electrode layer 102 that comprises titanium nitride (TiN) and is between about 100 Å and 1000 Å thick.

At step 608, the formed switching memory device 200B is optionally annealed at a temperature of greater than about 450° C. In one example, the formed switching memory device 200B is annealed at a temperature of greater than about 700° C. In another example, the formed switching memory device 200B is annealed at a temperature of between about 450° C. and about 1000° C. for a period of time between about 30 seconds and about 20 minutes. The process(es) performed at step 708, are generally configured to cause the layers disposed in the switching memory device 200B to form a desirable interface between adjacent layers as well as activate and/or desirably process the other layers formed in the switching memory device.

Process and Device Examples

In one example of a process of forming a switching memory device (FIG. 5C), after performing the steps 601-608 in the processing sequence 600, a memory element 112 is formed that comprises: an intermediate electrode 210 comprising an n-doped polysilicon layer, a variable resistance layer 206 that is about 50 Å thick and comprises hafnium oxide ($HfO_x$), a separation layer 205 that is between 30 Å and 1000 Å thick and comprises tantalum nitride (TaN), a current limiting layer 204 that is between about 50 Å and 500 Å thick and comprises doped zinc oxide ($ZnO_x$), and an electrode 102 that comprises a layer of titanium nitride (TiN). After forming the switching memory device 200B (FIG. 5A), then at least one thermal processing step is performed, such as step 608.

In another example of a process of forming a switching memory device, after performing the steps 601-608, a memory element 112 is formed that comprises: an intermediate electrode 210 comprising an n-doped polysilicon layer, a variable resistance layer 206 that is about 50 A thick and comprises hafnium oxide ($HfO_x$), a separation layer 205 that is between 30 Å and 1000 Å thick and comprises tantalum nitride (TaN), a stabilizing layer 208 that is between 30 Å and 500 Å and comprises indium tin oxide (ITO), a current limiting layer 204 that is between about 50 Å and 500 Å thick and comprises doped zinc oxide ($ZnO_x$), a stabilizing layer 207 that is between 30 Å and 500 Å and comprises indium tin oxide (ITO) and an electrode 102 that comprises a layer of titanium nitride (TiN). After forming the switching memory device 200B, then at least one thermal processing step is performed, such as step 608.

The foregoing is merely illustrative of the principles of this invention and various modifications can be made by those skilled in the art without departing from the scope and spirit of the invention as defined by the claims that follow.

The invention claimed is:

1. A nonvolatile memory element, comprising:
a first electrode;
a second electrode;
a variable resistance layer disposed between the first electrode and the second electrode, the variable resistance layer comprising a metal oxide;
a current limiting layer disposed between the variable resistance layer and the first electrode, wherein the current limiting layer comprises a varistor layer; and
an oxygen deficient material layer disposed between the current limiting layer and the variable resistance layer, wherein:
the current limiting layer is disposed between a first material layer and a second material layer, and
each of the first material layer and the second material layer comprise a material selected from the group of indium tin oxide and iridium oxide, and wherein the materials selected for each first material layer and second material layer are not the same.

2. The nonvolatile memory element of claim 1, wherein the variable resistance layer comprises a material selected from the group of hafnium oxide, zirconium oxide, lanthanum oxide, and aluminum oxide.

3. The nonvolatile memory element of claim 1, wherein the variable resistance layer has a thickness of between 20 angstroms and 100 angstroms.

4. The nonvolatile memory element of claim 1, wherein the current limiting layer comprises a material comprised of zinc oxide doped with one or more of bismuth, cobalt, or manganese.

5. The nonvolatile memory element of claim 1, wherein the current limiting layer has a thickness of between 50 angstroms and 500 angstroms.

6. The nonvolatile memory element of claim 1, wherein the oxygen deficient material layer comprises a material selected from the group of tantalum nitride, titanium nitride and tungsten nitride, silicon oxy-nitride, aluminum oxy-nitride, aluminum nitride, hafnium nitride zirconium nitride, boron nitride, calcium nitride, ruthenium titanium nitride, gold, zirconium platinum and platinum beryllium.

7. The nonvolatile memory element of claim 1, wherein the current limiting layer has a thickness of between 50 angstroms and 100 angstroms.

8. A nonvolatile memory element, comprising:
a first electrode;
a second electrode;
a variable resistance layer disposed between the first electrode and the second electrode, the variable resistance layer comprising a metal oxide;
a current limiting layer disposed between the first electrode and the variable resistance layer, the current limiting layer comprising a varistor layer;
an oxygen deficient material layer disposed between the current limiting layer and the variable resistance layer, the oxygen deficient material layer operable to inhibit oxygen from the variable resistance layer;
a first stabilizing layer; and
a second stabilizing layer,
wherein:
the current limiting layer is disposed between the first stabilizing layer and the second stabilizing layer, and the first stabilizing layer and second stabilizing layer are operable to provide oxygen to the current limiting layer, and
each of the first stabilizing layer and the second stabilizing layer comprise a material selected from the group of indium tin oxide and iridium oxide, and wherein the materials selected for each first stabilizing layer and second stabilizing layer are not the same.

9. The nonvolatile memory element of claim 8, wherein the variable resistance layer comprises a material selected from the group of hafnium oxide, zirconium oxide, lanthanum oxide and aluminum oxide.

10. The nonvolatile memory element of claim 8, wherein the variable resistance layer has a thickness of between 20 angstroms and 100 angstroms.

11. The nonvolatile memory element of claim 8, wherein the current limiting layer comprises a material comprised of zinc oxide doped with one or more of bismuth, cobalt, or manganese.

12. The nonvolatile memory element of claim 8, wherein the current limiting layer has a thickness of between 50 angstroms and 500 angstroms.

13. The nonvolatile memory element of claim 8, wherein the oxygen deficient material layer comprises a material selected from the group of tantalum nitride, titanium nitride, tungsten nitride, silicon oxy nitride, aluminum oxy-nitride, aluminum nitride, hafnium nitride zirconium nitride, gold, zirconium, platinum and platinum beryllium.

14. The nonvolatile memory element of claim 8, wherein the oxygen deficient material layer has a thickness of between 30 angstroms and 1000 angstroms.

15. The nonvolatile memory element of claim 8, wherein the first stabilizing layer and second stabilizing layer each have a thickness of between 50 angstroms and 1000 angstroms.

16. A method of forming a nonvolatile memory element, comprising:
forming a first electrode over a substrate;
forming a second electrode over the substrate;
forming a variable resistance layer between the first electrode and the second electrode, the variable resistance layer comprising a metal oxide;
forming a current limiting layer between the first electrode and the variable resistance layer;
forming a separation layer between the current limiting layer and the variable resistance layer, the separation layer comprising an oxygen deficient material; and
forming the current limiting layer between a fist material layer and a second material layer,
wherein each of the first material layer and the second material layer comprise a material selected from the group of indium tin oxide and iridium oxide, and wherein the materials selected for each first material layer and second material layer are not the same.

17. The method of claim 16, wherein the separation layer comprises a material selected from the group of tantalum nitride, titanium nitride and tungsten nitride, silicon oxy-nitride, aluminum oxy-nitride, aluminum nitride, hafnium nitride zirconium nitride, gold, zirconium platinum and platinum beryllium.

18. The method of claim 16, wherein the current limiting layer comprises a material comprised of zinc oxide doped with one or more of bismuth, cobalt, or manganese.

* * * * *